(12) United States Patent
Rastogi et al.

(10) Patent No.: US 12,375,127 B2
(45) Date of Patent: **\*Jul. 29, 2025**

(54) REJECTION OF END-OF-PACKET DRIBBLE IN HIGH SPEED UNIVERSAL SERIAL BUS REPEATERS

(71) Applicant: Texas Instruments Incorporated, Dallas, TX (US)

(72) Inventors: Srijan Rastogi, Bengaluru (IN); Mayank Garg, Ambala (IN); Anant Shankar Kamath, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/625,353

(22) Filed: Apr. 3, 2024

(65) Prior Publication Data

US 2024/0250715 A1 Jul. 25, 2024

Related U.S. Application Data

(63) Continuation of application No. 18/100,131, filed on Jan. 23, 2023, now Pat. No. 11,984,941, which is a continuation of application No. 17/382,499, filed on Jul. 22, 2021, now Pat. No. 11,563,462.

(51) Int. Cl.
*H04B 3/36* (2006.01)
*H03F 3/45* (2006.01)

(52) U.S. Cl.
CPC ........... *H04B 3/36* (2013.01); *H03F 3/45179* (2013.01)

(58) Field of Classification Search
CPC .............. H03F 3/45179; G06F 13/382; G06F 13/4282; G06F 2213/0042; G06F 13/4072; H04B 3/36; H04L 12/40032
See application file for complete search history.

(56) References Cited

U.S. PATENT DOCUMENTS

| | | |
|---|---|---|
| 10,014,957 B2 | 7/2018 | Maung et al. |
| 10,498,523 B1 | 12/2019 | Wang et al. |
| 11,563,462 B1 | 1/2023 | Rastogi et al. |
| 11,984,941 B2 * | 5/2024 | Rastogi ............... H04B 3/36 |
| 2016/0321210 A1 | 11/2016 | Baterina et al. |
| 2020/0034323 A1 | 1/2020 | Maung et al. |

\* cited by examiner

*Primary Examiner* — David S Huang
(74) *Attorney, Agent, or Firm* — John R. Pessetto; Frank D. Cimino

(57) ABSTRACT

Universal Serial Bus (USB) repeater circuits and methods of operating the same for communicating data signals from a first pair of data terminals to a second pair of data terminals of the repeater. In a first channel, an amplifier stage in a receiver amplifies a differential signal received at the first pair of data terminals to generate a differential signal at first and second output nodes of the receiver, and a transmitting circuit transmits a differential signal at the second pair of data terminals responsive to the differential signal at the first and second output nodes of the receiver. The receiver includes a hysteresis stage that receives an offset in opposition to the differential signal at the first and second output nodes of the receiver. End-of-packet (EOP) dribble in USB communications in the HS mode is reduced by the offset at the hysteresis stage.

15 Claims, 10 Drawing Sheets

REJECTION OF END-OF-PACKET DRIBBLE IN HIGH SPEED UNIVERSAL SERIAL BUS REPEATERS

CROSS-REFERENCE TO RELATED APPLICATIONS

This application is a continuation of U.S. patent application Ser. No. 18/100,131, filed Jan. 23, 2023, which is a continuation of U.S. patent application Ser. No. 17/382,499, filed Jul. 22, 2021, now U.S. Pat. No. 11,563,462, issued Jan. 24, 2023, which applications are hereby incorporated herein by reference.

BACKGROUND

This relates to serial data communication, and is more specifically directed to repeater circuits and functions in serial data communication.

Communication among modern electronic devices and peripherals using the Universal Serial Bus (USB) technology has become commonplace in recent years. USB communications are carried out according to industry standard specifications for cables and connectors, and for interface protocols over those cables and connectors. These protocols control the connection, communication, and power supply interfacing among computers (including smartphone handsets), peripherals, and other devices connecting to those computers. USB has largely supplanted other interconnection technologies for wide variety of consumer and enterprise level devices.

One attractive attribute of USB communications technology is its ease of use, particularly the flexibility with which the user can interconnect USB peripherals to a host or to other devices, particularly via hubs and bus splitters. The USB network is essentially self-configuring, allowing the user to simply plug in or remove a device from an ad hoc USB network without configuring device settings, interrupts, I/O addresses, and the like. From the manufacturer's standpoint, USB eliminates the need for the system designer to develop proprietary interfaces to later-developed peripheral devices, or to implement interface hardware and software that maintains "legacy" compatibility.

By way of background, USB standards provide for communication at a number of data rates, with each data rate class defined by protocols at the physical layer. Beginning with USB version 1.0, a "full-speed" (FS) USB data rate of 12 Mbps and a "low-speed" (LS) data rate of 1.5 Mbps have been defined. Later revisions of the USB standard, beginning with "Universal Serial Bus Specification Revision 2.0" (2000), defines a "high-speed" (HS) data rate of 480 Mbps. While the physical layer operating specifications and protocols for FS and LS communications are quite similar, the physical layer operating specifications and protocols for the HS data rate differ significantly from those for FS/LS communications.

By way of further background, "Embedded USB2 (eUSB2) Physical Layer Supplement to the USB Revision 2.0 Specification," Revision 1.1 (2018), describes signaling and protocols for an alternative USB physical layer technology, referred to as "embedded USB," "eUSB," or "eUSB2." More specifically, embedded USB is an implementation of USB 2.0 for small process nodes such as cellphones, tablets, and the like that are not well-suited to support the 3.3v input/output signaling levels of conventional USB. In eUSB2, the signaling levels are reduced to 1.2v for the FS and LS modes, and for the HS mode, to about half the levels of the USB2 HS signaling levels. eUSB2 also provides other enhancements that facilitate power efficiency. eUSB2 supports all of the LS, FS, and HS communication protocols of USB 2.0, and uses the same two data line configuration as USB 2.0 though operating at the lower signaling levels. eUSB2 connections may be made in two common configurations. In one mode, referred to as "native mode," an eUSB2 connection is directly made between two integrated circuits (e.g., between two so-called "system on a chip" or "SoC" devices), one serving as the "host" and the other as a USB "device." Native mode eUSB2 is most often used as a dedicated connection between SoC devices on the same circuit board because the lower signal levels of eUSB2 are incompatible with external USB ports. In this native mode configuration where both SoC devices are powered from the circuit board, the eUSB2 connection involves only the two data lines eD+ and eD−. Native mode eUSB2 communications are typically limited to relatively short interconnect trace lengths (e.g., on the order of 10 inches).

For USB communications between an SoC device (e.g., as a USB host) on a circuit board and an external USB device, a "repeater mode" eUSB2 configuration is used. In this repeater mode configuration, an eUSB2 repeater device, typically located on the same circuit board as the host SoC, communicates with the host SoC via eUSB2 and communicates with the external USB device using standard USB 2.0. eUSB2 repeaters can be configured as host repeaters, device repeaters, or even dual-role device repeaters that swap roles based on commands from the SoC. The USB interface of the eUSB2 repeaters can be paired with any of the standard USB connectors and can connect to USB hosts, hubs, devices, and can connect to other eUSB2 repeater-based applications.

USB-to-USB repeaters are also known in the art. For example, USB port isolators are repeater devices that implement galvanic isolation between USB ports, and thus block large voltage differences, prevent ground loops, and block common mode transients between different ground potentials of USB devices on either side of the isolator. Commonly owned and copending U.S. application Ser. No. 17/246,137, entitled "Isolated Universal Serial Bus Repeater with High Speed Capability," filed Apr. 30, 2021 and incorporated herein by reference, describes an example of such a USB port isolator. The term "USB repeater" will be used in this specification to refer to any type of repeater for USB communications, including eUSB2-to-USB repeaters, USB-to-USB repeaters, USB port isolators, and the like.

Unlike retimers, USB repeaters do not perform clock and data recovery, and instead operate to agnostically pass through received signals, with amplification and level shifting as appropriate (e.g., eUSB2-to-USB, or vice versa). Conventional USB repeaters include squelch detection to inhibit the transmission of noise received at its input as amplified signals at its output. For example, noise may be received at the input side of a USB repeater when both data lines (e.g., D+ and D− data lines for USB, or eD+ and eD− for eUSB2) are driven to a ground level following an end-of-packet (EOP) sequence in HS USB transmission. Because of inherent propagation delay, the squelch detection function does not immediately inhibit signal transmission when both input data lines go to ground following the EOP sequence, allowing noise on the input data lines to be retransmitted at the output of the USB repeater as spurious signal levels. These spurious signal levels are referred to in the art as "EOP dribble." Universal Serial Bus Specification Revision 2.0 specifies that EOP dribble may result in up to four random bits being added by the repeater data path.

It is within this context that the embodiments described herein arise.

SUMMARY

According to one aspect, a method of communicating Universal Serial Bus (USB) signals from a first pair of data terminals of a repeater to a second pair of data terminals of the repeater is provided. A differential signal received at the first pair of data terminals is amplified to generate a differential signal at first and second output nodes of a receiver circuit in the repeater, and a differential signal is transmitted at the second pair of data terminals responsive to the differential signal at the first and second output nodes. An offset is applied to a hysteresis stage in the receiver that is coupled to the first and second output nodes, that offset being in opposition to the differential signal generated at the first and second output nodes.

According to another aspect, a USB repeater comprises a first channel comprising a first receiver having differential inputs coupled to a first pair of terminals and a first transmitter having differential outputs coupled to a second pair of terminals. The first receiver comprises a first amplifier stage, having first and second inputs coupled to the first pair of terminals, and having first and second outputs coupled to first and second load devices, a hysteresis stage comprising a current source, first and second transistors having conduction paths coupled between the first and second outputs of the first amplifier stage, respectively, and the current source, and a second amplifier stage having differential inputs coupled to the first and second outputs of the first amplifier stage, and having first and second differential outputs coupled to differential inputs of the first transmitter. The repeater further comprises a second channel comprising a second receiver having differential inputs coupled to the second pair of terminals and having first and second differential outputs, and a second transmitter having differential inputs coupled to the first and second differential outputs of the second receiver and having differential outputs coupled to the first pair of terminals. First and second outputs of the second receiver are coupled to the control terminals of the first and second transistors, respectively, of the hysteresis stage of the first receiver.

Technical advantages enabled by one or more of these aspects include reduction in end-of-packet (EOP) dribble at a USB repeater for USB communications carried out in a high speed (HS) mode. Such reduction in EOP dribble can be attained without requiring additional trim bits or otherwise increasing die area or power consumption, and without adding significant jitter or latency. The reduction in EOP dribble may also be implemented in a manner that is independent of equalization at the receiver circuitry.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

The same reference numbers or other reference designators are used in the drawings to illustrate the same or similar (in function and/or structure) features.

DETAILED DESCRIPTION OF EMBODIMENTS

The one or more embodiments described in this specification are implemented into a Universal Serial Bus (USB) repeater device, as it is contemplated that such implementation is particularly advantageous in that context. However, it is also contemplated that aspects of these embodiments may be beneficially applied in other applications, such other arrangements USB-enabled electronic devices and systems. Accordingly, it is to be understood that the following description is provided by way of example only and is not intended to limit the true scope of this invention as claimed.

Figure 1:
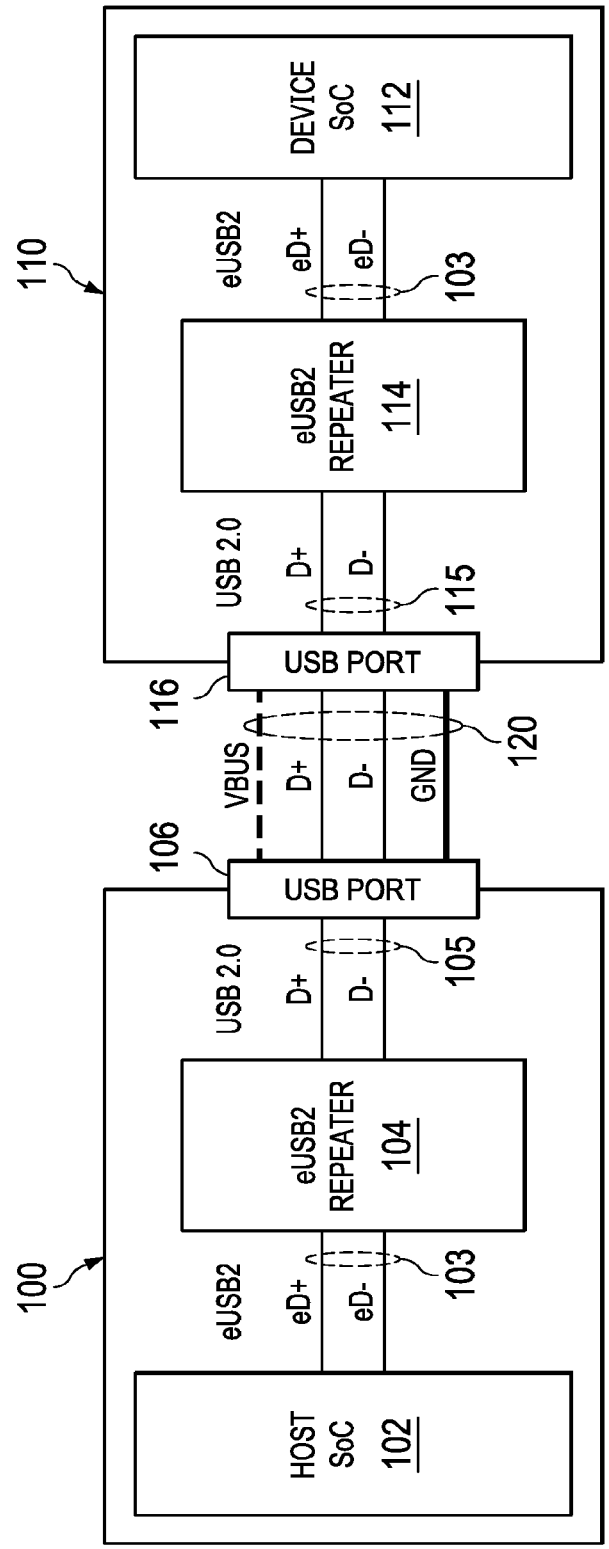
FIG. 1 is an electrical diagram, in block form, of a USB network in which example embodiments may be implemented.

FIG. 1 illustrates an example of a USB network between two circuit boards 100, 110 in which embodiments described in this specification may be implemented. Circuit board 100 includes host SoC 102, constructed to include integrated circuit functions suitable for its intended purpose. For example, host SoC 102 may be constructed and configured as a microcontroller, including a central processing unit, data and program memory, input/output functionality, and other such circuit functions. In this example, host SoC 102 is constructed to include eUSB2 input/output functionality for communication of data with eUSB2 repeater 104 via eUSB2 bus 103. In this example of native mode configuration, host SoC 102 and eUSB2 repeater 104 may both be powered from a common power supply (not shown) and a common ground level on circuit board 100, such that eUSB2 bus 103 includes data lines eD+ and eD− but need not include power and ground lines. eUSB2 repeater 104 in this example is coupled to USB port 106 via USB bus 105. USB bus 105, which operates according to the USB Revision 2.0 standard, includes data lines D+ and D−. Again, since USB port 106 and eUSB2 repeater 104 reside on the same circuit board 100 and may be powered from a common power supply and ground level, USB bus 105 need not include power and ground lines.

USB port 106 serves as an external USB port for circuit board 100. In this example, USB port 106 of circuit board 100 is coupled to USB port 116 of circuit board 110 via USB bus 120. In this example, USB bus 120 is a conventional four-line USB connection including power line VBUS, ground line GND, and data lines D+ and D−. According to the USB Revision 2.0 specification, USB bus 120 may be constructed as a USB four-wire cable of a length of up to 5 meters.

Circuit board 110 in this example includes device SoC 112 and eUSB2 repeater 114. Device SoC 112 in this example is constructed to include integrated circuit functions suitable for its intended purpose. For example, device SoC 112 may be constructed and configured as a microcontroller, including a central processing unit, data and program memory, input/output functionality, and other such circuit functions. Device SoC 112 is coupled to eUSB2 repeater 114 on circuit board 110 via eUSB2 bus 103, and eUSB2 repeater 114 is coupled to USB port 116 via USB bus 115. In this example, host SoC 112 and eUSB2 repeater 114 reside on the same circuit board 110 and may be powered from a common power supply and common ground level, allowing eUSB2 bus 103 to be a native mode link. As such, eUSB2 bus 113 includes data lines eD+ and eD− and need not include power and ground lines. Similarly, USB bus 115 includes data lines D+ and D− and need not include power and ground lines since USB port 116 and eUSB2 repeater 114 reside on the same circuit board 100 in this example.

Either or both of circuit boards 100, 110 may include other circuitry and functionality. Such other circuitry may include ancillary circuitry such as control circuitry, power supply and voltage regulator circuitry, clock circuitry, input/output circuitry, and the like appropriate for the intended function of circuit boards 100, 110. In addition, either or both of host SoC 102 and device SoC 112 may be coupled to other devices on circuit board 100, 110, respectively, via a "native mode" eUSB2 connection. In such native mode eUSB2 connections between devices are powered from the same circuit board, the eUSB2 bus will include only the two data lines eD+ and eD−.

Furthermore, the designation of host SoC 102 as the "host" and device SoC 112 as the "device" in the example of FIG. 1 relates to a current USB communications session or link between the two SoC devices. In other communications sessions or links, SoC 112 may serve as the "host" and SoC 102 as the "device".

According to current USB and eUSB2 specifications, data signals are communicated over the two data lines (D+ and D−, or eD+ and eD−, as the case may be) using differential "1" and differential "0" levels. Referring to USB buses 105, 115, 120 of FIG. 1 by way of example, a differential "1" is indicated by the D+ data line at a voltage above that of the D− data line by more than the specified level (e.g., 2.8v in USB 2.0 for the FS and LS modes), while a differential "0" is indicated by the D− data line at a voltage above that of the D+ data line by more than the specified level. By way of shorthand, the differential "1" level is referred to as the "J" state and the differential "0" level is referred to as the "K" state. The state in which both data lines are at a low level is commonly referred to as a "single ended zero", or "SE0," condition. On a low speed (LS) or full speed (FS) USB link, a Single Ended Zero (SE0) state for two bit periods is used to indicate End of Packet (EOP), and an idle state is indicated by a J condition at the two data lines following the EOP indicator.

For HS USB communications, the differential "1" and "0" states are indicated by a differential voltage of 400 mV. Because the idle state in an HS link is effectively a SE0 with both data lines at ground, the SE0 state is not available to indicate an EOP in the HS mode. Rather, in HS USB communications, an EOP is indicated by an intentional bit stuff error, for example a sequence of seven consecutive data states of the opposite state from the last symbol of the packet. For example, if the last symbol prior to the EOP is a "J" state, the EOP indicator would be the sequence "KKKKKKK." Following the intentional bit stuff error, the data lines D+ and D− (or eD+ and eD−, as the case may be) both return to the ground level to indicate the HS idle state according to the USB Revision 2.0 specification.

Figure 2:
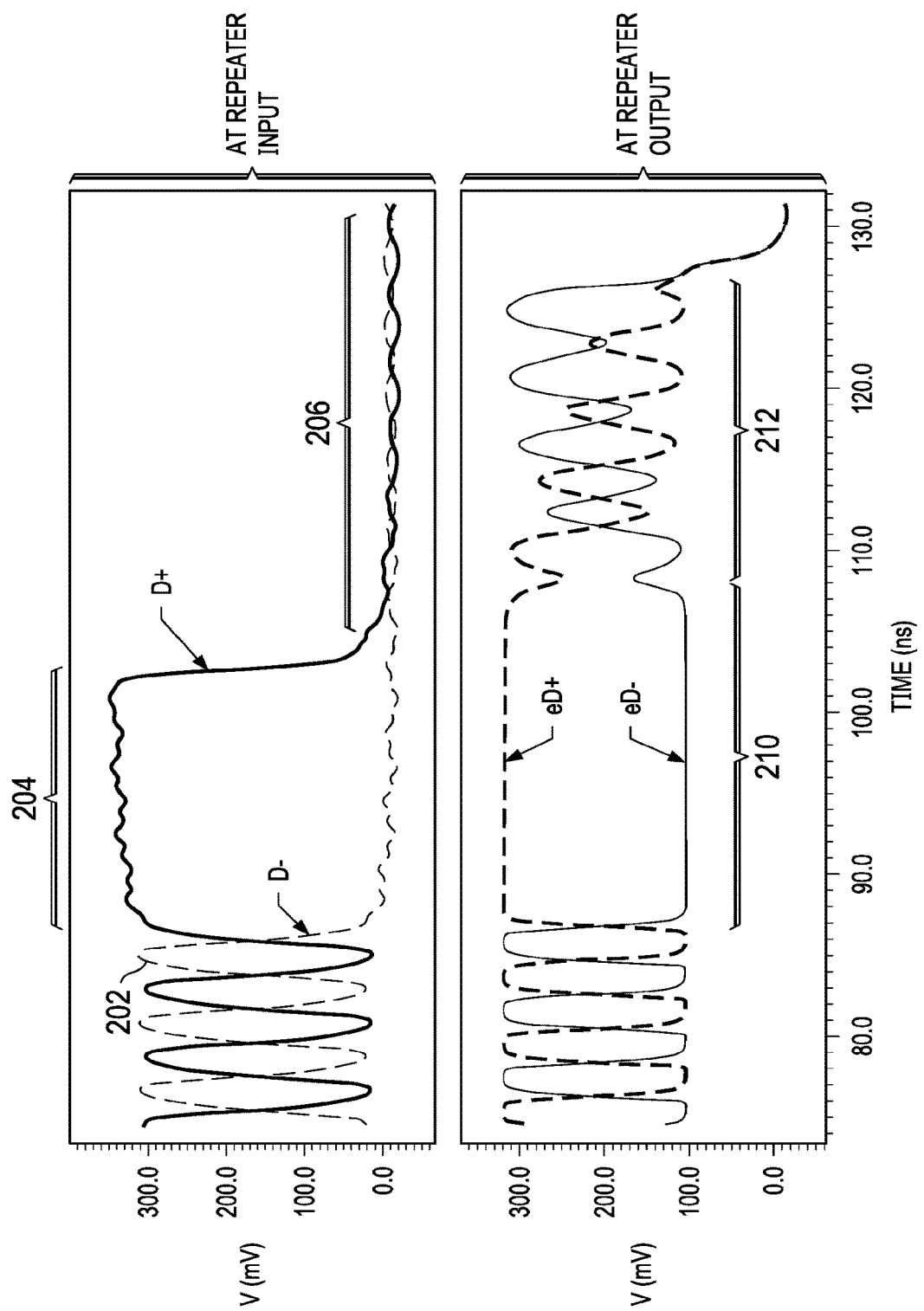
FIG. 2 is a timing diagram illustrating effects of EOP dribble in conventional repeaters.

As discussed above in the Background, "EOP dribble" refers to spurious signals transmitted by a USB repeater in response to noise received at the repeater input in the idle state following an EOP indication in a USB HS link, and before such time as squelch detection in the USB repeater disables the transmitter side in the USB repeater. FIG. 2 is a timing diagram illustrating an example of EOP dribble, for the example of a conventional eUSB2 repeater. The example of FIG. 2 illustrates the operation of a conventional eUSB2 repeater that receives USB 2.0 signals from an external host device via, for example, a conventional USB cable and forwards eUSB2 signals to an SoC on the same circuit board. The top timing diagram in FIG. 2 illustrates the USB 2.0 signals as received by this conventional eUSB2 repeater, in which a sequence of alternating J and K states ends with a final "K" state 202 (data line D− high and data line D+ low), followed by an EOP indicator 204 of a long (e.g., seven bit periods) "J" state. As shown in the lower timing diagram of FIG. 2, this conventional eUSB2 repeater transmits the long "J" state sequence 210 at its output data lines eD+ and eD− in response to EOP indicator 204 received at its inputs. Following the EOP indicator 204, the transmitting host device ceases transmission, allowing terminations in the USB link to pull both data lines D+ and D− to ground, in idle state indicator 206.

As shown in FIG. 2, however, noise is present in idle state indicator 206 as received by the eUSB2 repeater, due to high frequency reflections in the USB cable and other channel non-idealities. This received noise will typically have an amplitude below the squelch detection threshold of the repeater. However, propagation delay in the squelch detection circuitry delays the time at which transmission is inhibited following the onset of an SE0 state received at the repeater input. During this delay, the conventional eUSB2 repeater amplifies the idle state indicator noise 206 and transmits a number of spurious and random differential signals 212 at data lines eD+ and eD− as shown in FIG. 2. These spurious signals 212 are referred to in the USB Revision 2.0 specification as EOP dribble. Unfortunately, these spurious EOP dribble signals may exceed the squelch threshold at the receiving downstream USB device, and thus be falsely interpreted as valid data at the receiving device. EOP dribble can cause corruption of the EOP indicator itself, data error, or even link failure. EOP dribble can similarly arise in eUSB2-to-USB2 and USB to USB transmissions as well.

According to one or more embodiments, eUSB2 repeaters 104, 114 in the USB network of FIG. 1 can be constructed and operate to reduce, if not eliminate, EOP dribble. According to one or more of these embodiments, this reduction of EOP dribble can be attained without significant increases in semiconductor die area or power consumption by the USB repeater. According to one or more of these embodiments, this reduction of EOP dribble can be attained in a manner that is independent of equalization settings at the USB repeater, and without requiring additional "trim". Moreover, this reduction of EOP dribble can be attained in a scalable manner, and applicable to any of the eUSB2-to-USB (or vice versa), eUSB2-to-eUSB2, or USB-to-USB situations.

Figure 3:
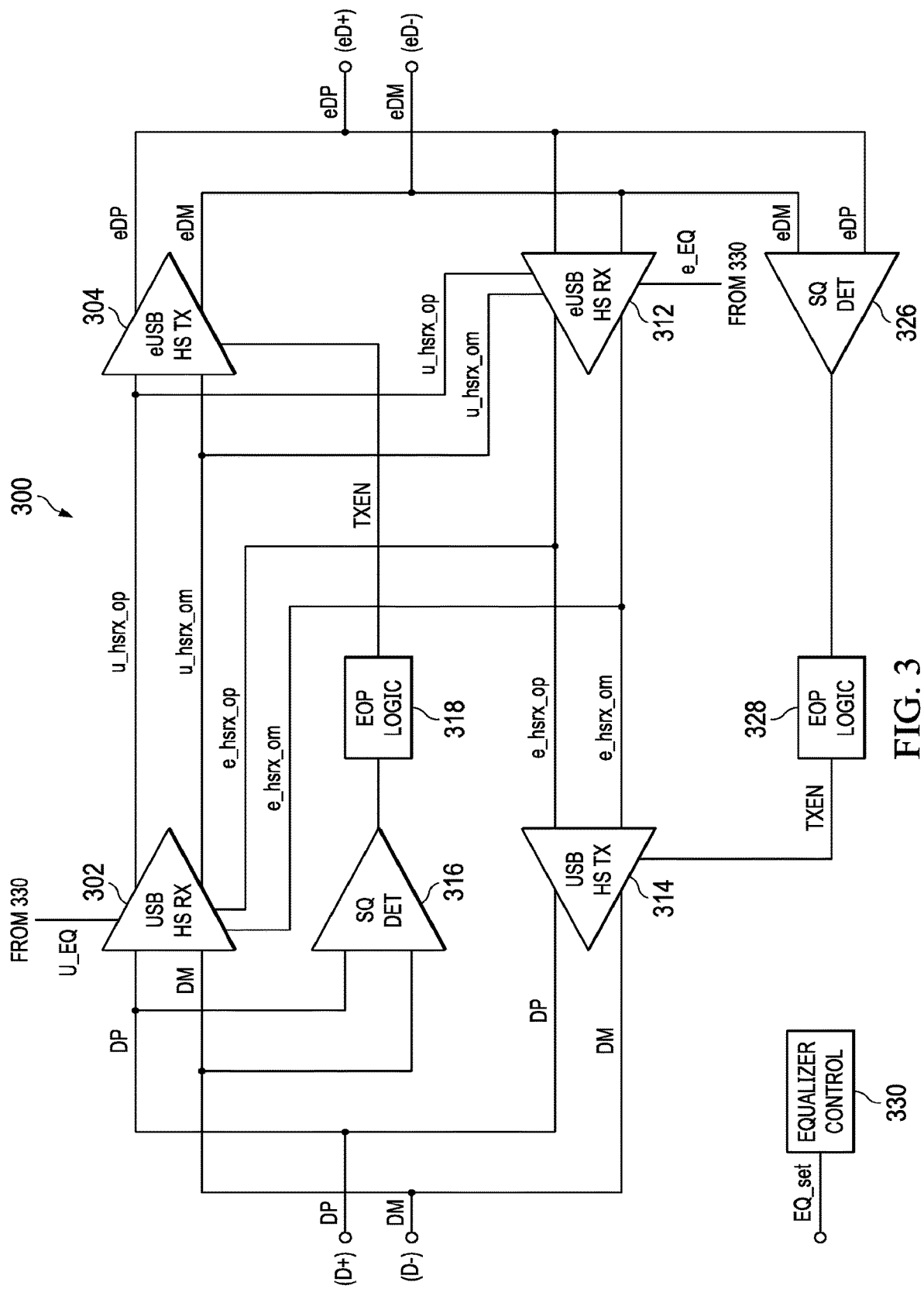
FIG. 3 is an electrical diagram, in block form, of a repeater according to an example embodiment.

FIG. 3 illustrates the construction of eUSB2 repeater 300 according to an embodiment. Repeater 300 according to this example may be used to realize either or both of eUSB2 repeater 104 and eUSB2 repeater 114 in the USB network of FIG. 1. Alternatively, repeater 300 may be used in other applications in which an eUSB2 repeater is useful, including as a host repeater, device repeater, or a dual-role device repeater, and can be paired with any of the standard USB connectors for connection to USB hosts, hubs, devices, and other eUSB2 repeater-based applications.

As shown in FIG. 3 and as described above in connection with eUSB2 repeaters 104, 114 of FIG. 1, repeater 300 has terminals for coupling to USB 2.0 data lines D+ and D− and has terminals for coupling to eUSB data lines eD+ and eD−. In this example, USB HS receiver 302 of repeater 300 has inputs coupled to USB data lines D+ and D− via lines DP and DM, respectively. USB HS receiver 302 includes equalization and amplification circuitry for application to received HS USB transmissions, as will be described in detail below, and has differential outputs coupled to corresponding differential inputs of eUSB HS transmitter 304 via lines u_hsrx_op, u_hsrx_om. eUSB HS transmitter 304 includes amplification and level shift circuitry, and has differential outputs coupled to terminals eD+, eD− via lines eDP, eDM.

Squelch detector 316 is provided to monitor signal levels at USB terminals D+, D−, and to control the transmission of signals in the USB-to-eUSB2 direction accordingly. In this example embodiment, squelch detector 316 has differential inputs coupled to terminals D+, D− via lines DP, DM, respectively. An output of squelch detector 316 is coupled to an input of end-of-packet logic 318, which has an output coupled to an enable input of eUSB HS transmitter 304 via line TXEN. Squelch detector 316 together with EOP logic 318 operate in the conventional manner in this example embodiment, to disable eUSB HS transmitter 304 via a signal on line TXEN in response to the received differential signal at terminals D+, D− being below a squelch threshold level. In effect, squelch detector 316 considers differential signals at terminals D+, D− that are below the threshold level to be noise rather than signal and disables transmission of corresponding signals from the eUSB2 port. Conversely, of course, squelch detector 316 and EOP logic 318 operate to enable eUSB HS transmitter 304 in response to receiving differential signals at terminals D+, D− that are above the threshold level.

For communications in the opposite, eUSB2-to-USB, direction, repeater 300 includes eUSB HS receiver 312, which has inputs coupled to terminals eD+, eD− via lines eDP, eDM. eUSB HS receiver 312 includes equalization and amplification circuitry for application to received HS eUSB2 transmissions, and has differential outputs coupled to corresponding differential inputs of USB HS transmitter 314 via lines e_hsrx_op, e_hsrx_om. USB HS transmitter 314 includes amplification and level shift circuitry, and has differential outputs coupled to terminals D+, D− via lines DP, DM.

Repeater 300 similarly includes squelch detection circuit 326 and corresponding EOP logic 328 for communications in the eUSB2-to-USB direction. Squelch detector 326 has inputs coupled to terminals eD+, eD− via lines eDP, eDM, respectively, and has an output coupled to an input of EOP logic 328 which presents enable signal TXEN to an enable terminal of USB HS transmitter 314 in response to the determination by squelch detector 326. The squelch threshold level for eUSB2-to-USB communications may differ (e.g., be lower) than that for USB-to-eUSB2 communications, given the difference in signal levels between the two link types.

Repeater 300 also includes other ancillary circuitry, such as control circuitry, power supply and reference voltage generator and regulator circuitry, and the like as useful for realizing the intended purpose of repeater 300. In the example of FIG. 3, repeater 300 includes equalizer control circuitry 330, which has an input coupled to one or more terminals EQ_set and outputs coupled to USB HS receiver 302 and eUSB HS receiver 312. As will be described in further detail below, equalizer control circuitry 330 enables external control of the frequency response of USB HS receiver 302 and eUSB HS receiver 312.

Repeater 300 also has the capability of serving as a repeater for communications in the FS and LS operating modes. Separate receiver and transmitter circuitry for these lower speed operating modes will be implemented in repeater 300 in parallel with the HS receiver and transmitter circuitry shown in FIG. 3; such FS and LS circuitry is not shown in FIG. 3 for the sake of clarity. In addition, repeater 300 may be implemented as a dual-port repeater, with two pairs of eUSB2 input/output terminals and two pairs of standard USB input/output terminals. In such a dual-port arrangement, a cross-point multiplexer will be included in eUSB2 repeater, for example deployed on signal lines u_hsrx_op, u_hsrx_om between the USB HS receivers and the eUSB HS transmitters, and on signal lines e_hsrx_op, e_hsrx_om between the eUSB HS receivers and the USB HS transmitters. If implemented to have two ports of each type in this manner, repeater 300 may have an additional external terminal to receive a control signal indicating the intended routing between the ports. Such a cross-point multiplexer may also be implemented in the FS/LS channel in repeater 300, and operable in response to the same external control signal.

According to this example embodiment, the differential outputs of eUSB HS receiver 312 on lines e_hsrx_op, e_hsrx_om are coupled to USB HS receiver 302 as shown in FIG. 3. Similarly, the differential outputs of USB HS receiver 302 on lines u_hsrx_op, u_hsrx_om are coupled to eUSB HS receiver 312. According to this example embodiment, eUSB HS receiver 312 feeds back signal levels output by eUSB HS transmitter 304 to USB HS receiver 302 to introduce hysteresis in the amplification of the received USB signal by USB HS receiver 302. Similarly, rather than being idle during eUSB2-to-USB communications through repeater 300, USB HS receiver 302 feeds back signal levels output by USB HS transmitter 314 to eUSB HS receiver 312 to introduce hysteresis in the amplification of the received eUSB signal by eUSB HS receiver 312. As will be described below, this introduced data-independent hysteresis serves to reduce, if not eliminate, the transmission of EOP dribble in HS USB communications.

Figure 4A:
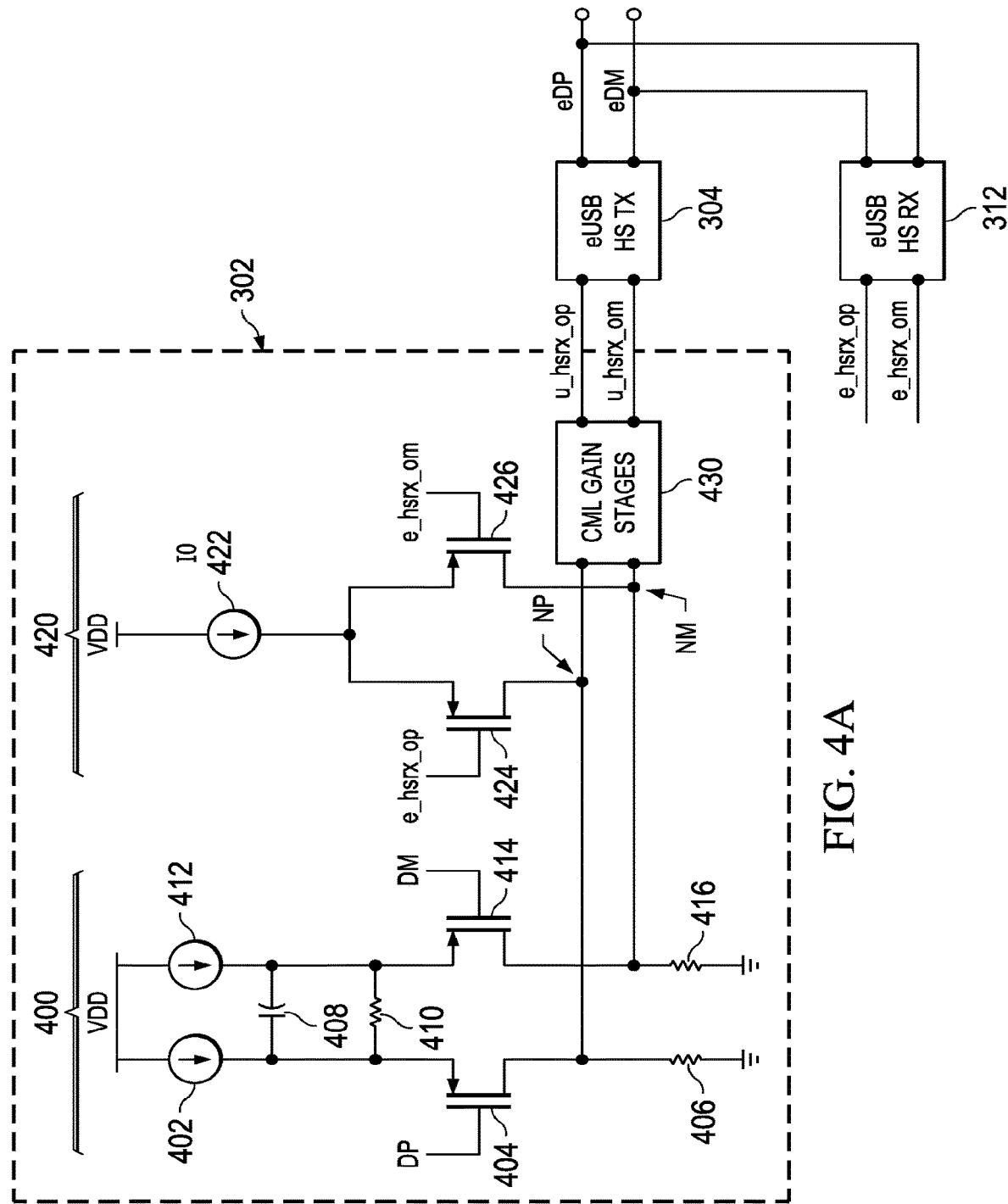
FIG. 4A is an electrical diagram, in block and schematic form, of a USB HS channel in the repeater of FIG. 3 according to an example embodiment.

FIG. 4A illustrates the construction of USB HS receiver 302 according to an example embodiment. In a first amplifier stage 400 of USB HS receiver 302, p-channel MOS (PMOS) transistor 404 has a gate coupled to line DP, and PMOS transistor 414 has a gate coupled to line DM. As such, the gates of PMOS transistors 404, 414 receive the differential signal at terminals D+, D− via lines DP, DM, respectively. The source of PMOS transistor 404 is coupled to the VDD power supply via current source 402, and the drain of PMOS transistor 404 is coupled to circuit ground via resistor 406. Similarly, the source of PMOS transistor 414 is coupled to the VDD power supply via current source 412, and the drain of PMOS transistor 414 is coupled to circuit ground via resistor 416.

Capacitor 408 and resistor 410 are coupled in parallel between the source terminals of transistors 404, 414. As will be described below, capacitor 408 and resistor 410 may be implemented as a variable capacitor and variable resistor, respectively, with their capacitance and resistance values set in response to equalization control signals received at external terminals of repeater 300 for example. Capacitor 408 and resistor 410 serve as a continuous time linear equalizer in USB HS receiver 302 by shaping the frequency response of amplifier stage 400, for example to increase gain for higher frequency signal components and decrease gain for lower frequency signal components.

As shown in FIG. 4A, the differential output of amplifier stage 400 in USB HS receiver 302 is presented at the drain of PMOS transistor 404 (node NP of FIG. 4A) and the drain of PMOS transistor 414 (at node NM). As evident from the construction of amplifier stage 400, the polarity of the differential signal at nodes NP, NM will be opposite the polarity of the differential signal at lines DP, DM. USB HS receiver 302 further includes hysteresis stage 420. Hysteresis stage 420 includes current source 422 conducting a current I0 from the VDD power supply to a common node at the source terminals of PMOS transistor 424 and PMOS transistor 426. The gate of PMOS transistor 424 is coupled to an output of eUSB HS receiver 312 via line e_hsrx_op, and the gate of PMOS transistor 426 is coupled to another output of eUSB HS receiver 312 via line e_hsrx_om. The drain of PMOS transistor 424 is coupled to node NP, and the drain of PMOS transistor 426 is coupled to node NM.

Nodes NP, NM at the drains of PMOS transistors 424, 426 are coupled to differential inputs of additional amplifier stages 430, for further amplification prior to application to eUSB HS transmitter 304 via lines u_hsrx_op and u_hsrx_om, respectively. In this example embodiment, amplifier stages 430 are constructed as one or more common mode logic (CML) amplifier stages to amplify the differential signal at nodes NP, NM by an intended gain.

Other transistor types, such as n-channel MOS transistors, other types of field-effect transistors, bipolar or BiCMOS technology transistors, and the like may be used instead of or in combination with the illustrated PMOS transistors in realizing the circuitry described in this specification, along with such modifications to the circuit as appropriate to incorporate devices of such alternative technology so as to carry out the functions of those circuits as described herein.

As previously mentioned, USB communications over a given link are half-duplex, in that communications are carried out in only one direction at a time during the communications session; accordingly, traffic will be communicated through repeater 300 in only one direction at a time. According to this example embodiment, eUSB HS receiver 312 in repeater 300 remains enabled during communications from the USB port (terminals D+, D−) to the eUSB2 port (terminals eD+, eD−). In operation during USB-to-eUSB communications, the differential output presented by eUSB HS transmitter 304 on lines eDP, eDM in response to the differential signal on lines DP, DM is also applied to the differential input of eUSB HS receiver 312 in the eUSB-to-USB path of repeater 300. eUSB HS receiver 312 amplifies this differential signal output by eUSB HS transmitter 304 by some gain and presents the amplified differential signal at its output on lines e_hsrx_op, e_hsrx_om. The differential output signal from eUSB HS receiver 312 on lines e_hsrx_op, e_hsrx_om is applied to the gates of PMOS transistors 424, 426, respectively, in hysteresis stage 420 of USB HS receiver 302.

In operation, hysteresis stage 420 develops an offset in response to the differential signal across the gates of PMOS transistors 424, 426. This offset steers the current I0 from current source 422 more strongly through one of transistors 424, 426 than the other. In this example embodiment, this offset is in opposition to the differential signal at nodes NP, NM developed by amplifier stage 400 in response to the differential signal on lines DP, DM.

For example, if line DP is at a positive differential voltage above that of line DM, PMOS transistor 414 will be turned on more strongly than PMOS transistor 404, and node NP will be pulled to a lower voltage (closer to ground) than node NM. Through the operation of amplifier stages 430 in USB HS receiver 302 and also eUSB HS transmitter 304, this differential voltage will be further amplified to appear as a positive differential signal at lines eDP, eDM, and via eUSB HS receiver 312, a positive differential signal on line e_hsrx_op relative to line e_hsrx_om. This differential signal will turn on PMOS transistor 426 more strongly than PMOS transistor 424, steering a majority of current I0 through transistor 426 into node NM. This additional current through resistor 416 will raise the voltage at node NM relative to node NP, reducing the differential voltage between nodes NP, NM.

Conversely, if line DP is at a negative differential voltage, below that of line DM, PMOS transistor 424 will be turned on more strongly than PMOS transistor 414, pulling node NM to a lower voltage (closer to ground) than node NP. Accordingly, eUSB HS transmitter 304 will present a negative differential signal at lines eDP, eDM, which will be presented by eUSB HS receiver 312 as a negative differential signal on lines e_hsrx_op, e_hsrx_om. This negative differential signal will turn on PMOS transistor 424 more strongly than PMOS transistor 426, steering a majority of current I0 through transistor 424 into node NP. This additional current through resistor 406 will raise the voltage at node NP relative to node NM, again reducing the differential voltage between nodes NP, NM in this state.

According to this example embodiment, therefore, the operation of hysteresis stage 420 in USB HS receiver 302 opposes the differential signal developed by amplifier stage 400 at nodes NP, NM in response to the differential signal at terminals D+, D−. The extent to which hysteresis stage 420 opposes this differential signal will depend on the magnitude of the current I0 sourced by current source 422, as well as the differential signal at lines e_hsrx_op, e_hsrx_om. More specifically, the magnitude of current I0 should be selected so that noise at terminals D+, D− of the magnitude of expected noise following an EOP indicator (e.g., as shown in FIG. 2) is attenuated by hysteresis stage 420 so that the following amplification stages 430 and eUSB HS transmitter 304 do not generate a significant differential signal at terminals eD+, eD− as a result of the received noise. For example, the magnitude of current I0 may be selected so that noise at terminals D+, D− of a magnitude at or below the squelch detection threshold does not result in a detectable differential signal at terminals eD+, eD−. In one example, the magnitude of current I0 is selected so that noise at terminals D+, D− at a selected margin below the squelch detection threshold does not result in a detectable differential output signal. On the other hand, the magnitude of current I0 should of course not be so large as to disrupt the transmission of actual signals received at terminal D+, D− of repeater 300.

Figure 4B:
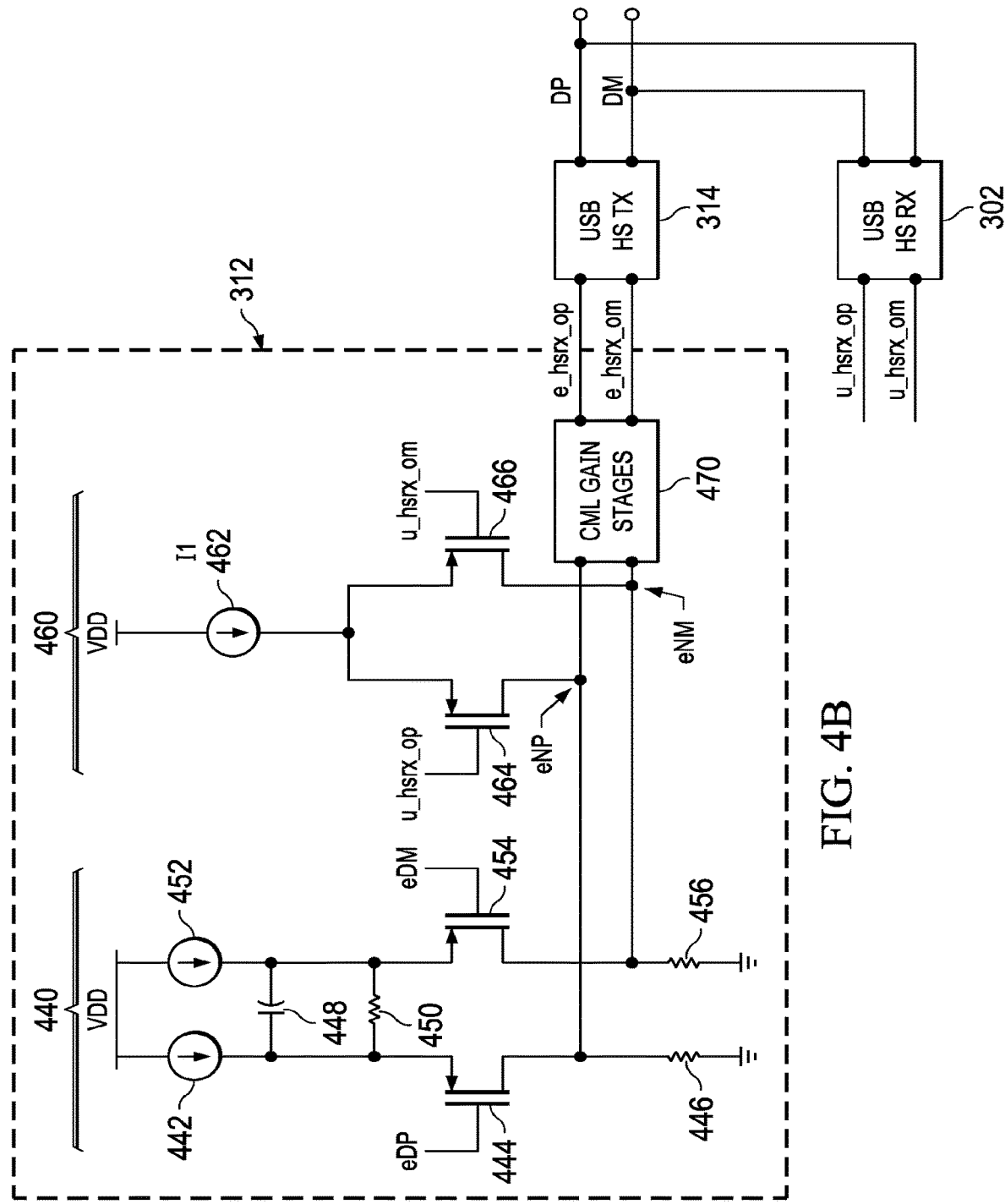
FIG. 4B is an electrical diagram, in block and schematic form, of another USB HS channel in the repeater of FIG. 3 according to an example embodiment.

As noted above, similar hysteresis is applied in the eUSB2-to-USB direction. FIG. 4B illustrates the construction of eUSB2 HS receiver 312 according to an example embodiment. The construction of eUSB2 HS receiver 312 is substantially similar to that of USB HS receiver 302 described above relative to FIG. 4A but from the standpoint of transistor sizes and passive component values, is configured suitably for signals of different signal levels (e.g., eUSB2 levels) than those applied to USB HS receiver 302 of FIG. 4A.

More specifically, a first amplifier stage 440 of USB HS receiver 312 includes PMOS transistor 444 with a gate coupled to line eDP and thus terminal eD+, and PMOS transistor 454 with a gate coupled to line eDM and thus terminal eD−. The source of PMOS transistor 444 is coupled to the VDD power supply via current source 442, and the source of PMOS transistor 454 is coupled to the VDD power supply via current source 452. The drain of PMOS transistor 444, at node eNP, is coupled to circuit ground via resistor 446, and the drain of PMOS transistor 454, at node eNM, is coupled to circuit ground via resistor 456. Capacitor 448 and resistor 450 are coupled in parallel between the source terminals of transistors 444, 454 to provide an equalizer as described above.

As shown in FIG. 4B, eUSB2 HS receiver 312 further includes hysteresis stage 460, constructed similarly as hysteresis stage 420 in USB HS receiver 302. Hysteresis stage 460 includes a current source 462 conducting a current I1 from the VDD power supply to a common node at the source terminals of PMOS transistor 464 and PMOS transistor 466. It is contemplated that current I1 will differ from current I0 applied by current source 422 in hysteresis stage 420 of USB HS receiver 302 described above, due to the different signal and noise levels of eUSB2 signals as compared with USB 2.0 signals. The gate of PMOS transistor 464 is coupled to an output of USB HS receiver 302 via line u_hsrx_op, and the gate of PMOS transistor 466 is coupled to another output of USB HS receiver 302 via line u_hsrx_om. The drain of PMOS transistor 464 is coupled to node eNP, and the drain of PMOS transistor 466 is coupled to node eNM.

Nodes eNP, eNM at the drains of PMOS transistors 464, 466 are coupled to differential inputs of one or more additional amplifier stages 470, for further amplification prior to application to USB HS transmitter 314 via lines e_hsrx_op, e_hsrx_om, respectively. Amplifier stages 470 are constructed as one or more common mode logic (CML) amplifier stages to apply the intended gain to the differential signal at nodes eNP, eNM. USB HS receiver 302 is coupled to lines DP, DM (and terminals D+, D−, respectively), as described above relative to FIG. 4A.

eUSB HS receiver 312 of FIG. 4B operates substantially in the same manner as USB HS receiver 302 described above relative to FIG. 4A. More specifically, hysteresis stage 460 develops an offset in response to the differential signal output by USB HS receiver 312 on lines u_hsrx_op, u_hsrx_om and applied at the gates of PMOS transistors 464, 466, respectively. This offset operates to steer the current I1 from current source 462 more strongly through one of transistors 464, 466 than the other. As described above with respect to FIG. 4A, this offset is in opposition to the differential signal at nodes eNP, eNM as developed by amplifier stage 440 in response to the received differential signal at lines eDP, eDM.

For example, a positive differential voltage at line eDP relative to line eDM will result in node eNP being pulled closer to ground than node eNM due to the operation of amplifier stage 440. This differential voltage will be amplified to appear as a positive differential signal at lines DP, DM and, via USB HS receiver 302, as a positive differential signal on lines u_hsrx_op, u_hsrx_om. This differential signal will turn on PMOS transistor 466 in hysteresis stage 460 more strongly than PMOS transistor 464, steering a majority of current I1 through transistor 466 into node eNM, raising its voltage relative to node eNP and tending to reduce the differential voltage between nodes eNP, eNM.

Conversely, if line eDP is at a negative differential voltage relative to line DM, amplifier stage 440 will pull node eNM closer to ground than node eNP. After amplification (and inversion) by CML gain stages 470 and USB HS transmitter 314, a negative differential signal will appear at lines DP, DM and, through the operation of USB HS receiver 302, will appear as a negative differential signal on lines u_hsrx_op, u_hsrx_om. This negative differential signal will turn on PMOS transistor 464 in hysteresis stage 460 more strongly than PMOS transistor 466, steering a majority of current I1 through transistor 464 into node eNP, raising its relative to node eNM, and thus reducing the differential voltage between nodes eNP, eNM in this data state.

Similarly as for hysteresis stage 420 in USB HS receiver 302, the extent to which hysteresis stage 460 opposes the differential signal at terminals eD+, eD− depends on the magnitude of the current I1 sourced by current source 462, and also on the differential signal on lines u_hsrx_op, u_hsrx_om. Current I1 should be selected to reject the noise expected at terminals eD+, eD− following an EOP indicator so that amplification stages 470 and USB HS transmitter 314 do not generate a significant differential signal at terminals D+, D− as a result. Again, the magnitude of current I1 should of course not be so large as to disrupt the transmission of actual signals received at terminal eD+, eD− of repeater 300.

In the manufacture of conventional USB repeaters, a "trim" process is commonly performed on the USB and eUSB2 receivers in order to trim out DC offset in the differential amplifiers (e.g., CML amplifiers) due to statistical variation in transistor sizes and other non-idealities. It has been discovered, in connection with one or more embodiments, that the inclusion of a hysteresis stage to limit EOP dribble, such as hysteresis stages 420, 460 in repeater 300 as described above relative to FIG. 4A and FIG. 4B, does not require the addition of additional trim circuitry (e.g., "trim bits") or processes from that used for trimming offset in the other amplifier stages, and avoids the impact on manufacturing cost of the additional trim bits.

Figure 5:
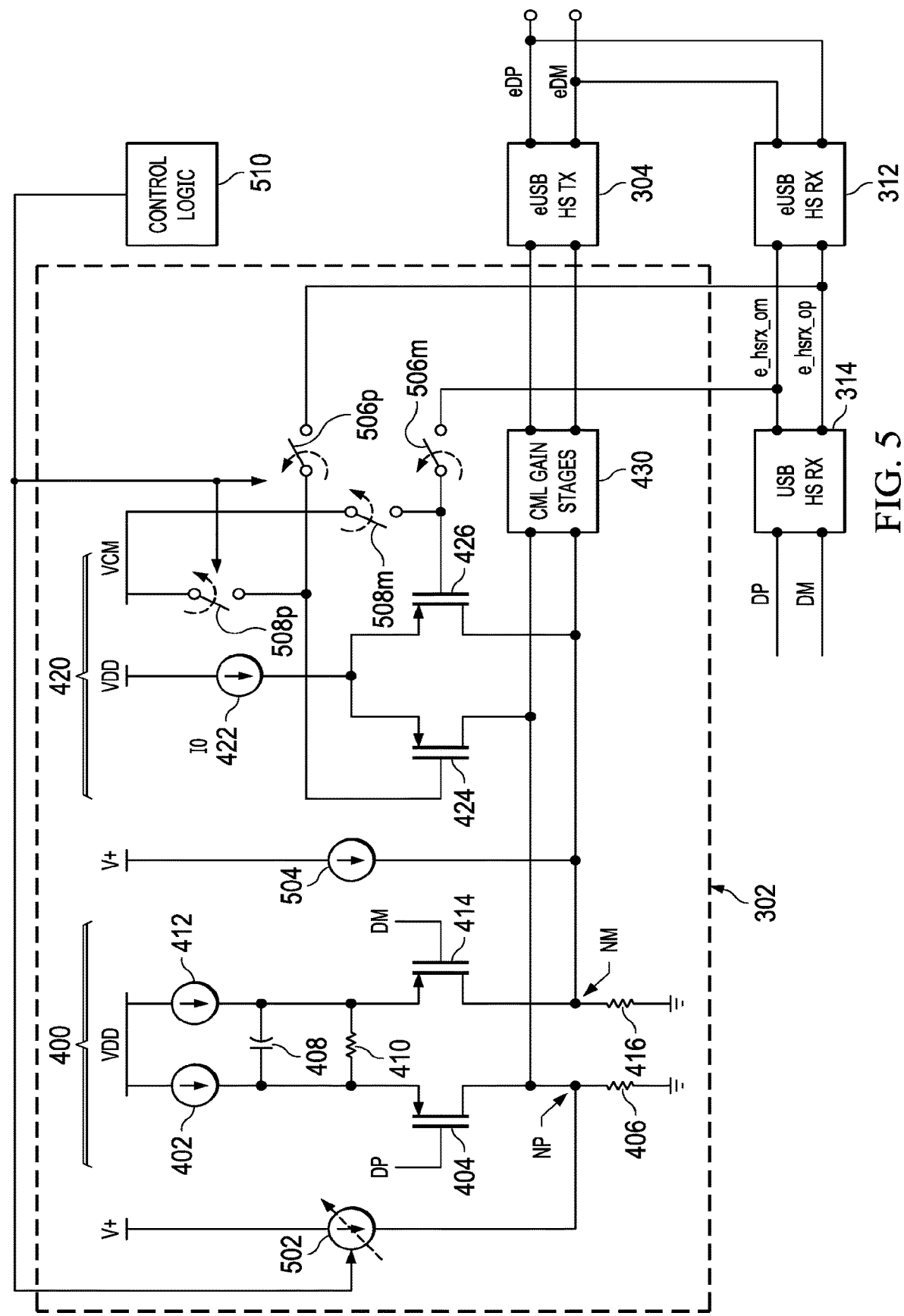
FIG. 5 is an electrical diagram, in block and schematic form, of a USB HS channel including trim circuitry in the repeater of FIG. 3 according to an example embodiment.

FIG. 5 further illustrates the construction of USB HS receiver 302 as including trim circuitry according to an embodiment. As described above in connection with FIG. 4A, FIG. 5 illustrates USB HS receiver 302 as including first amplifier stage 400 receiving differential lines DP, DM from terminals D+, D−, respectively (not shown). First amplifier stage 400 is followed by hysteresis stage 420 as described in connection with FIG. 4A, followed by CML amplifier stages 430. As described above, the differential output presented by eUSB HS transmitter 304 on lines eDP, eDM is fed back to the gates of PMOS transistors 424, 426, respectively, in hysteresis stage 420 via lines e_hsrx_op, e_hsrx_om.

For purposes of trimming offset in USB HS receiver 302 as shown in FIG. 5, variable current source circuit 502 is coupled between a reference supply voltage V+ and node NP at the drain of PMOS transistor 404, and constant current source 504 is coupled between a reference supply voltage V+ and node NM at the drain of PMOS transistor 414. USB HS receiver 302 further includes switch 506p coupled between line e_hsrx_op and the gate of PMOS transistor 424, and switch 506m coupled between line e_hsrx_om and the gate of PMOS transistor 426. USB HS receiver 302 also includes switch 508p coupled between a common mode voltage VCM and the gate of transistor 424, and switch 508m coupled between common mode voltage VCM and the gate of transistor 424. Switches 506, 508 may be constructed as MOS transistors or pass gates, or otherwise realized. Reference voltage generators or other similar circuitry (not shown) may be provided in repeater 300 to source common mode voltage VCM and reference supply voltage V+, among others. Control logic 510 (including, e.g., digital logic circuitry, a processor, and/or analog circuitry) is configured to control the open and closed state of switches 506, 508, and the current conducted by variable current source circuit 502 during the trimming operation as described below.

The trimming operation is typically performed during manufacture of repeater 300, such as an electrical test of repeater 300 in die form or after packaging. The result of the trimming process is to modify the device to compensate for offset in the amplifier stages. This modification can be performed by such techniques as laser trimming resistors, blowing fuse or antifuse links with a laser, shorting out Zener diodes or other semiconductor devices, modifying the polysilicon resistors, or storing digital bits in a non-volatile memory internal to the device.

In the example of USB HS receiver 302 shown in FIG. 5, the trimming process is realized by stepping or sweeping the current applied by variable current source 502 to node NP in first amplifier stage 400 while a known common mode voltage is applied to lines DP, DM at the gates of transistors 404, 414. During this trimming operation, switches 506p, 506m are opened to decouple the inputs of hysteresis stage 420 from the feedback on lines e_hsrx_op, e_hsrx_om, and switches 508p, 508m are closed to couple the inputs of hysteresis stage 420 (e.g., the gates of transistors 424, 426) to common mode voltage VCM. Hysteresis stage 420 is thus effectively removed from affecting any differential signal at nodes NP, NM. Current source 504 applies a constant current at node NM to allow the current applied by variable current source 502 to be of one polarity (e.g., positive). The differential voltage developed at nodes NP, NM at each of the multiple current levels output by variable current source 502 is monitored, for example at lines edm, edp (FIG. 5), to measure the current from variable current source 502 that provides the intended output differential voltage and that thus compensates for offset in first amplifier stage 400 and the subsequent CML gain stages 430. The appropriate circuit modification is then made to make permanent the compensating current output by variable source 502. Switches 508p, 508m are then opened and switches 506p, 506m are closed to apply feedback to hysteresis stage 420 for normal operation.

According to this example embodiment, eUSB HS receiver 312 similarly includes trim circuitry such as described for USB HS receiver 302 relative to FIG. 5. The trimming of both of USB HS receiver 302 and eUSB HS receiver 312 in repeater 300 ensures that the differential signals fed back from one receiver to the other (e.g., on lines e_hsrx_op, e_hsrx_om to receiver 302, and on lines u_hsrx_op, u_hsrx_om to receiver 312) are themselves properly trimmed for offset. According to this example embodiment, therefore, additional trim circuitry or processes need not be provided in repeater 300 for hysteresis stages 420, 460, but rather the trim circuitry and process already provided for trimming the amplifier stages suffices. No additional trim bits need be added for hysteresis stages 420, 460 according to this example embodiment. Rather, while switches 506, 508 (and their counterparts in eUSB HS receive 312) and the corresponding control logic included in this example embodiment are not contemplated to require significant additional die area or consume significant additional power.

As noted above, USB HS receiver 302 and eUSB HS receiver 312 each include equalization. In the example of FIG. 4A, this equalization is provided in USB HS receiver 302 by capacitor 408 (which may be fixed or variable in some embodiments) and resistor 410 (which may be fixed or variable in some embodiments) coupled in parallel between the source nodes of PMOS transistors 404, 414 in first amplifier stage 400. Similarly, equalization is provided in eUSB HS receiver 312 by capacitor 448 (which may be fixed or variable in some embodiments) and resistor 450 (which may be fixed or variable in some embodiments) coupled in parallel between the source nodes of PMOS transistors 444, 454 in first amplifier stage 440. In high-speed serial communications such as USB 2.0 and eUSB2 in which intersymbol interference is of concern, equalization generally sets the frequency response of USB HS receiver 302 and eUSB HS receiver 312 to boost higher frequencies and attenuate lower frequencies. In repeater 300 of this example embodiment, as described above, equalizer control circuitry 330 allows user selection of the equalizer frequency response. For example, the equalizer of variable capacitor 408 and variable resistor 410 in USB HS receiver 302 may have a finite number of settings that select among a set of frequency responses for receiver 302. In this example embodiment, equalizer control circuitry 330 receives a digital value from one or more terminals EQ_set, and selects the corresponding equalizer setting for each of USB HS receiver 302 and eUSB HS receiver 312.

It has been observed, however, the noise in the SE0 idle state indicator (e.g., idle state indicator 206) communications, such as would be received at USB repeater 300 following an end of packet sequence in the HS USB mode, is largely high frequency noise. Accordingly, equalization in USB HS receiver 302 and eUSB HS receiver 312 will not only boost the high frequency signal content but will also boost the high frequency noise that can cause EOP dribble. Stronger hysteresis as applied by hysteresis stages 420, 460 may thus be necessary to prevent EOP dribble for that frequency response. On the other hand, a flatter equalization setting (i.e., reduced high frequency gain) may allow less hysteresis to be applied by hysteresis stages 420, 460 and thus improve signal sensitivity and resolution.

Figure 6:
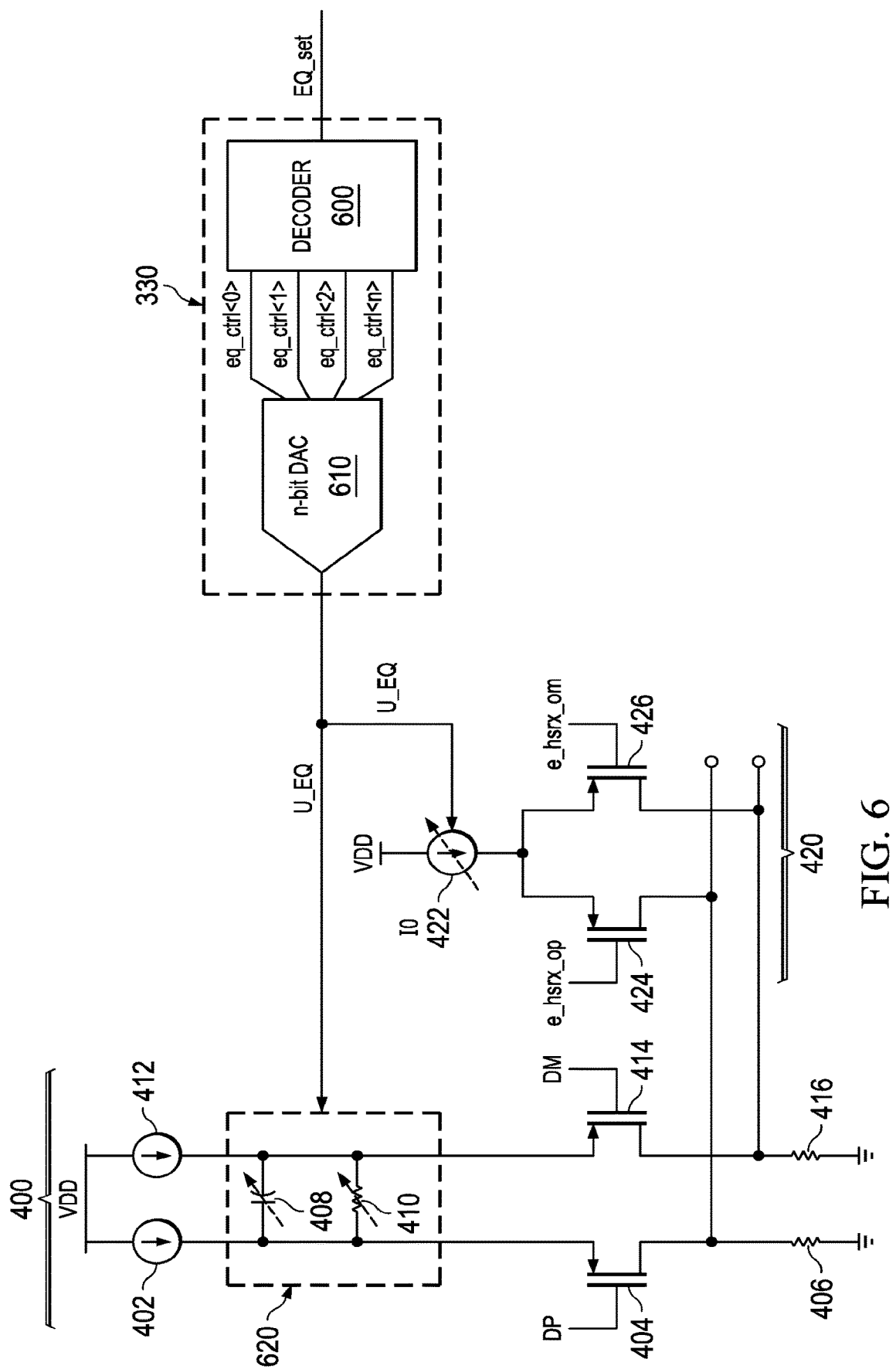
FIG. 6 is an electrical diagram, in block and schematic form, of a USB HS channel including equalization circuitry in the repeater of FIG. 3 according to an example embodiment.

According to an embodiment, the offset applied by hysteresis stages 420, 460 can be adjusted with the equalization setting, as will now be described in connection with FIG. 6. In this example embodiment, a portion of equalization control circuitry 330 is shown as including decoder 600 with an input coupled to one or more terminals EQ_set, and having outputs coupled to lines eq_ctrl<0> through eq_ctrl<n> to indicate selection of one of n+1 equalization settings corresponding to a digital value received at terminals EQ_set. Digital-to-analog converter (DAC) 610 receives the selection signals on lines eq_ctrl<0> through eq_ctrl<n> at its inputs, and has an output presenting an analog signal U_EQ in response to the selection signals on lines eq_ctrl<0> through eq_ctrl<n>. Analog signal U_EQ is applied to equalizer 620 (e.g., to either or both of variable capacitor 408 and variable resistor 410), to establish the corresponding equalization setting for USB HS receiver 302 in this example. In addition, according to this example embodiment, current source 422 is a variable current source configured to conduct current I0 at a level corresponding to analog signal U_EQ from DAC 610 of equalization control circuitry 330. Accordingly, the current I0 provided by current source 422 in hysteresis stage 422 varies with the equalization setting applied to equalizer 620 in first amplifier stage 400 of USB HS receiver 302.

As noted above, higher equalization (i.e., more boost at high frequencies in the frequency response) in USB HS receiver 302 will amplify the high frequency noise in the SE0 state following an end-of-packet indicator in the HS mode. This increased high frequency boost calls for hysteresis stage 420 to increase its offset (i.e., hysteresis) to reduce or inhibit EOP dribble. In this example embodiment, a higher current I0 in hysteresis stage 420 increases the applied offset. Accordingly, the same analog signal U_EQ from DAC 610 can be applied to both equalizer 620 in first amplifier stage 400 of receiver 302 and also to current source 422 of hysteresis stage 420, such that the current I0, and thus the level of offset, will increase with higher settings of equalizer 620 in this example embodiment.

It is contemplated that similar control of the equalization applied in eUSB HS receiver 312 and corresponding adjustment of the offset applied by hysteresis stage 460 will be implemented in eUSB HS receiver 312. For example, equalization control circuitry 330 may include an additional DAC for separately setting the equalization and offset for the eUSB2-to-USB communications, as the channel conditions on opposite sides of repeater 300 may vary from one another.

As evident from the foregoing, the example embodiments described above are in the context of an eUSB2-to-USB repeater. According to other embodiments, reduction of EOP dribble can also be enabled in the context of an isolating repeater. In some situations, the system ground levels of devices connecting via USB are at different voltages, or the power consumption of one of the USB-connected devices can cause significant common mode transients. In these situations, galvanic isolation is desirable at the USB interface between the connecting devices. To that end, USB transceivers of a type referred to as isolating USB repeaters have been introduced. Isolating repeaters provide a USB interface, such as at a bus splitter or hub, that includes an isolation barrier between the input and output sides of the repeater, and across which USB communications are made according to the applicable USB standard. USB isolating repeaters are commonly used between USB 2.0 or higher devices, with both interfaces signaling at the full 3.3v differential level. Alternatively, it is contemplated that USB repeaters providing an interface between eUSB2 and USB 2.0 devices may also incorporate an isolation battier. In any case, the isolation barrier of an isolating repeater galvanically isolates USB devices on either side of the repeater, enabling the blocking of large voltage differences, the preventing of ground loops, and the blocking of common mode transients between the different ground potentials of the communicating devices.

Figure 7:
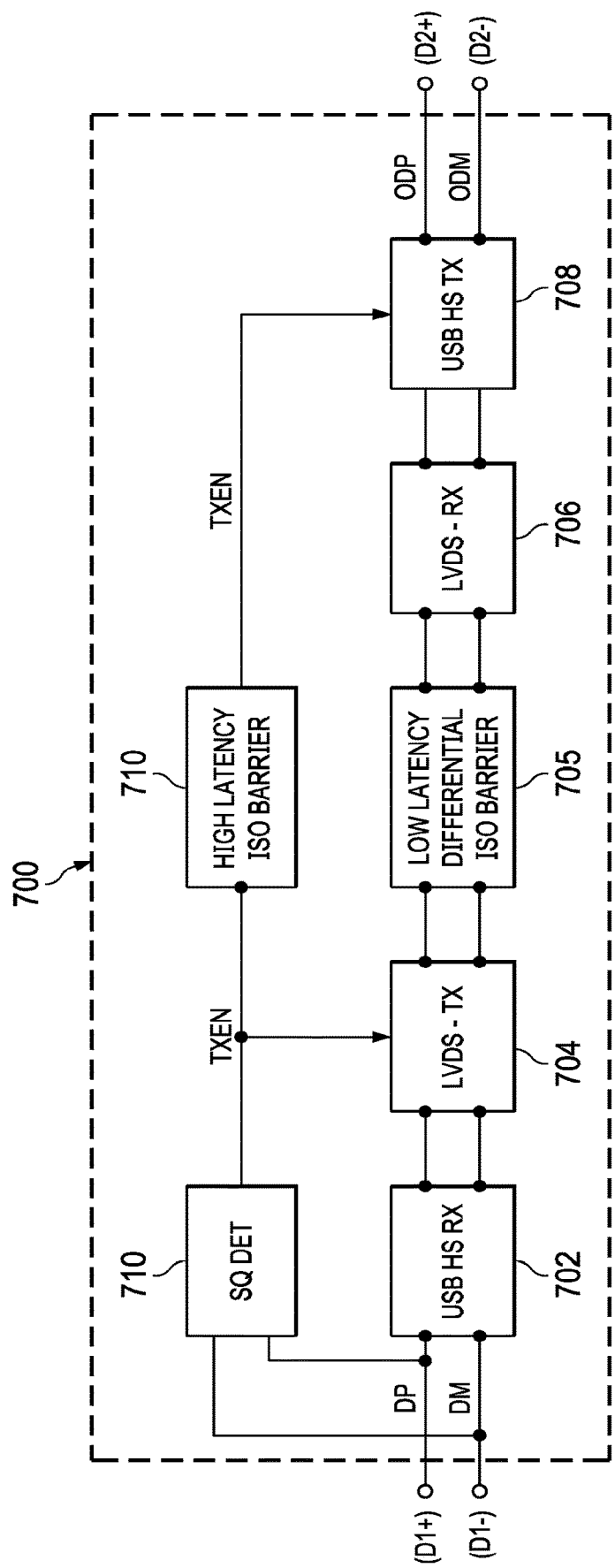
FIG. 7 is an electrical diagram, in block form, of an isolating repeater according to an alternative example embodiment.

FIG. 7 is a high level block diagram of the USB HS channel of an USB isolating repeater 700 according to one or more embodiments. As noted above, USB communications are half-duplex. The block diagram example of FIG. 7 illustrates an HS channel in one direction (e.g., left-to-right in the view of FIG. 7), it being understood that a reverse (e.g., right-to-left) channel will also be provided in repeater 700. On the input side of the HS channel in repeater 700, USB HS receiver 702 receives a differential input at terminals D1+, D1− via lines DP, DM, respectively. Receiver 702 operates to amplify this signal and present the amplified received signal to low voltage differential signal transmitter (LVDS-TX) 704. LVDS-TX 704 includes transmitter circuitry for transmitting the received signals at the desired signal levels and protocol across isolation barrier 705 to the output side of this USB HS channel of isolating repeater 700.

Isolation barrier 705 provides galvanic isolation between the two sides of isolating repeater 700. Isolation barrier 705 may be implemented according to any one of a number of approaches. For example, isolation barrier may be implemented as a double capacitive insulation barrier, or alternatively as a coupled inductor pair. Other technologies that may be used to implement isolation barrier 705 include optical, wireless, piezoelectric, Giant Magnetoresistive (GMR), and others. As noted in FIG. 7, isolation barrier 705 in the signal path of isolating repeater 700 may be realized to transmit differential signals with a relatively low latency.

On the output side of the USB HS channel of isolating repeater 700, low voltage differential signal receiver (LVDS-RX) 706 is coupled to isolation barrier 705 to amplify differential signals transmitted across isolation barrier 705 for presentation, at its output, to an input of USB HS transmitter 708. USB HS transmitter 708 amplifies and level shifts the amplified signals from LVDS-RX 706 for transmission as differential logic signals over output lines ODP, ODM, which are coupled to terminals D2+, D2− of isolating repeater 700. Because of the isolation provided by isolation barrier 705, USB HS receiver 702 and LVDS-TX 704 may be biased from a different power supply and ground level than LVDS-RX 706 and USB HS transmitter 708. In some embodiments, isolating repeater 700 is implemented in/on a single semiconductor substrate and/or a single semiconductor package. In other embodiments, circuitry 702 704 and 710 may be implemented in/on one semiconductor substrate/package and circuitry 706 and 708 may be implemented in/on another semiconductor substrate/package. In some embodiments, isolation barrier 705/710 are implemented in/on a separate semiconductor substrate/package.

Squelch detection is provided in isolating repeater 700 in this example embodiment of FIG. 7. Squelch detection circuit 710 has inputs coupled to lines DP, DM and an output at which it presents transmit enable signal on line TXEN. Squelch detection circuit 710 in this example can include both a squelch detection function and also EOP logic for detecting the end of a packet, such as described above with respect to FIG. 3. Line TXEN is coupled to USB HS transmitter 708 via isolation barrier 710, which in this example embodiment may have a higher latency than that of isolation barrier 705 in the data path. Line TXEN is also coupled to LVDS-TX 704 on the receiver side of isolation barrier 705. In a similar manner as described above, squelch detection circuit 710 operates to enable and disable USB HS transmitter 708 and LVDS-TX 704 via transmit enable signal on line TXEN in response to the amplitude of the received differential signal on lines DP, DM relative to a squelch threshold level. In effect, squelch detection circuit 710 considers differential signals at terminals D1+, D1− that are below the squelch threshold level to be noise rather than signal, and accordingly disables transmission of corresponding signals onto data terminals D2+, D2−. LVDS-TX 704 is also disabled in this event. Conversely, in response to receiving differential signals at terminals D1+, D1− that are above the squelch threshold level, squelch detector 710 operates to enable LVDS-TX 704 and USB HS transmitter 708. Given the propagation delay of squelch detection circuit 710 and the latency of isolation barrier 715, some EOP dribble can occur prior to disabling of transmission by squelch detection circuit 710.

As noted above, a reverse HS channel (i.e., terminals D2+, D2− as a differential input to terminals D1+, D1− as a differential output) will also be provided by isolating repeater 700. This reverse channel will include its own isolation barrier. In addition, separate channels for LS/FS USB communications in either direction will also often be included in isolating repeater 700, each channel having an isolation barrier.

The construction of USB HS receiver 702 in isolating repeater 700 according to an example embodiment will now be described in connection with FIG. 8. Similarly as in USB HS receiver 302 described above relative to FIG. 4A, USB HS receiver 702 includes first amplifier stage 840 receiving the differential signal at terminals D+, D− via lines DP, DM. First amplifier stage 840 includes p-channel MOS transistor 804 having a gate coupled to line DP and p-channel MOS transistor 814 having a gate coupled to line DM. The source of PMOS transistor 804 is coupled to the VDD power supply via current source 802, and the drain of PMOS transistor 804 is coupled to circuit ground via resistor 806. Similarly, the source of PMOS transistor 814 is coupled to the VDD power supply via current source 812, and the drain of PMOS transistor 814 is coupled to circuit ground via resistor 816.

Also similarly as discussed above, first amplifier stage 840 includes an equalizer constructed in this example as a continuous time linear equalizer 815 formed by variable capacitor 808 and variable resistor 810 coupled in parallel between the source terminals of transistors 804, 814. Variable capacitor 808 and variable resistor 410 may have capacitance and resistance values set by equalization control signals as described above.

Also similarly as described above relative to FIG. 4A, the drain of PMOS transistor 804 (node NP of FIG. 8) and the drain of PMOS transistor 814 (at node NM) are coupled to the drain nodes of PMOS transistor 424 and PMOS transistor 426, respectively, of hysteresis stage 842. Hysteresis stage 842 includes a current source 822 conducting a current I0 from the VDD power supply to a common node at the source terminals of PMOS transistor 824 and PMOS transistor 826. Nodes NP, NM are coupled to CML stages 830 for further amplification, prior to presentation to LVDS-TX 704 and transmission across isolation barrier 705, as noted above.

To maintain isolation between the opposite sides of isolation barrier 705, the offset applied by hysteresis stage 842 is controlled from LVDS-TX 704 in this example embodiment. Specifically, the gate of PMOS transistor 824 in hysteresis stage 842 is coupled to a differential output of LVDS-TX 704 via line buff_lvds_op, and the gate of PMOS transistor 826 is coupled to a differential output of LVDS-TX 704 via line buff_lvds_om. The signal at the output of first amplifier stage 840 at nodes NP, NM, as amplified and buffered by CML stages 830 and LVDS-TX 704, thus establishes an offset in hysteresis stage 842 due to the differential signal across the gates of PMOS transistors 824, 826. This offset steers the current I0 from current source 822 more strongly through one of transistors 824, 826 than the other in opposition to the differential signal at nodes NP, NM as developed by amplifier stage 840.

For example, if line DP is at a positive differential voltage relative to line DM, PMOS transistor 814 will be turned on more strongly than PMOS transistor 804, and node NP will be pulled to a lower voltage (closer to ground) than node NM. Amplification by CML stages 830 in USB HS receiver 302 and LVDS-TX 704 will develop a positive differential signal on line buff_lvds_op relative to line buff_lvds_om. Applied as feedback to hysteresis stage 842, this differential signal will turn on PMOS transistor 826 more strongly than PMOS transistor 824, steering a majority of current I0 through transistor 826 into node NM and raising the voltage at node NM relative to node NP. As a result, the differential voltage between nodes NP, NM is reduced through the action of hysteresis stage 842.

As described above relative to FIG. 4A, a negative differential input signal received at lines DP, DM will result in node NM pulled lower (closer to ground) than node NP at the output of first amplifier stage 840. This will result in a negative differential signal on lines buff_lvds_op, buff_lvds_om. Applied to hysteresis amplifier stage 842, this negative differential signal will turn on PMOS transistor 824 more strongly than PMOS transistor 826, steering a majority of current I0 through transistor 824 into node NP and raising the voltage at node NP relative to node NM. The differential voltage between nodes NP, NM is again reduced by hysteresis stage 842 in this example embodiment.

According to this example embodiment, therefore, hysteresis stage 842 of USB HS receiver 802 opposes the differential signal developed by amplifier stage 840 at nodes NP, NM in response to the differential signal at terminals D1+, D1−. The magnitude of the offset at hysteresis stage 842 will again depend on the magnitude of the current I0 sourced by current source 822, as well as the magnitude of the offset communicated by the differential signal on lines buff_lvds_op, buff_lvds_om. As described above, the magnitude of this current I0 should be selected so that noise at terminals D1+, D1− of the magnitude of expected noise following an EOP indicator (e.g., as shown in FIG. 2) is attenuated by hysteresis stage 842 to avoid generation of a significant differential signal at terminals D2+, D2− as a result of the received noise.

Figure 8:
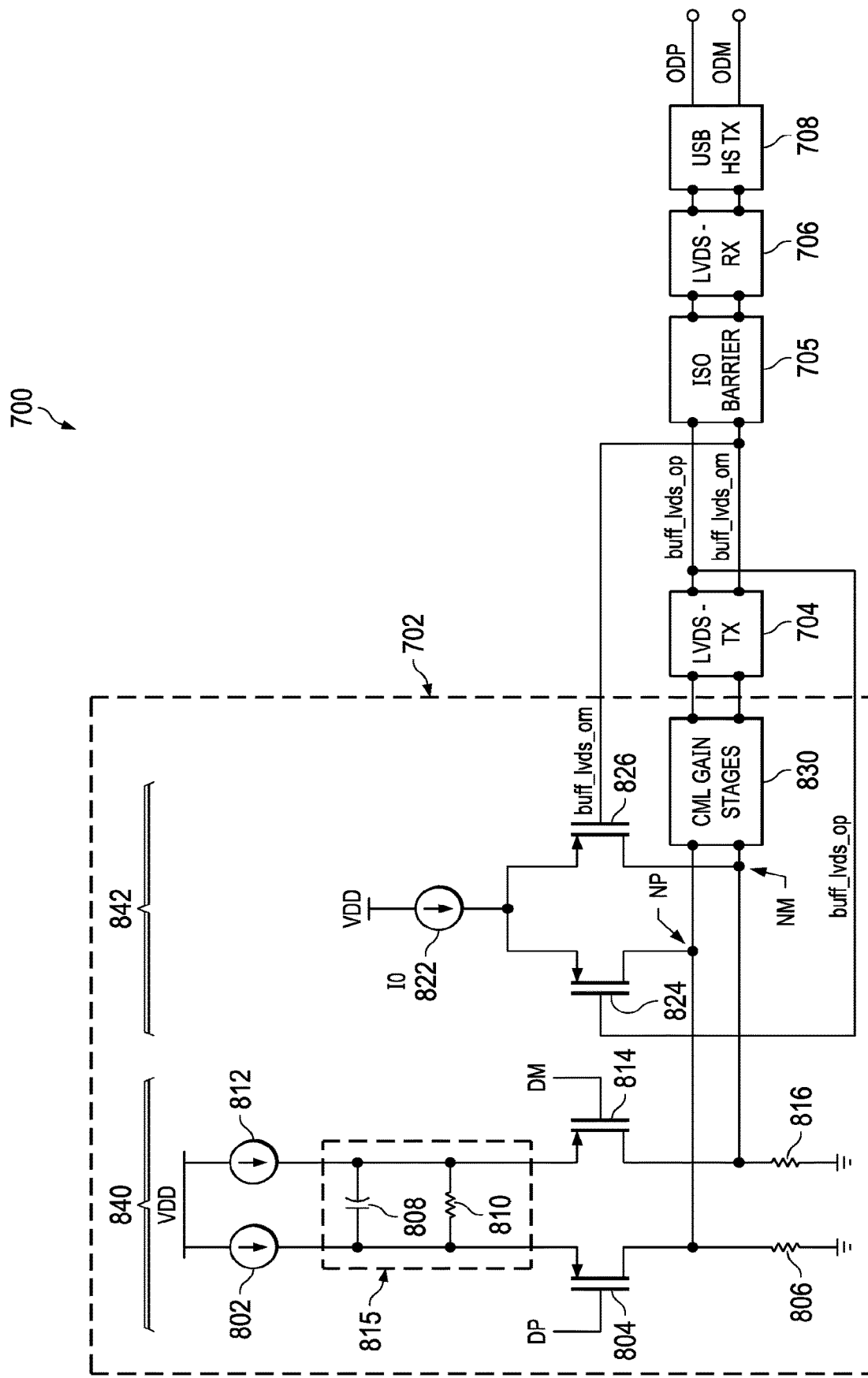
FIG. 8 is an electrical diagram, in block and schematic form, of a USB HS channel in the isolating repeater of FIG. 7 according to an example embodiment.
Figure 9:
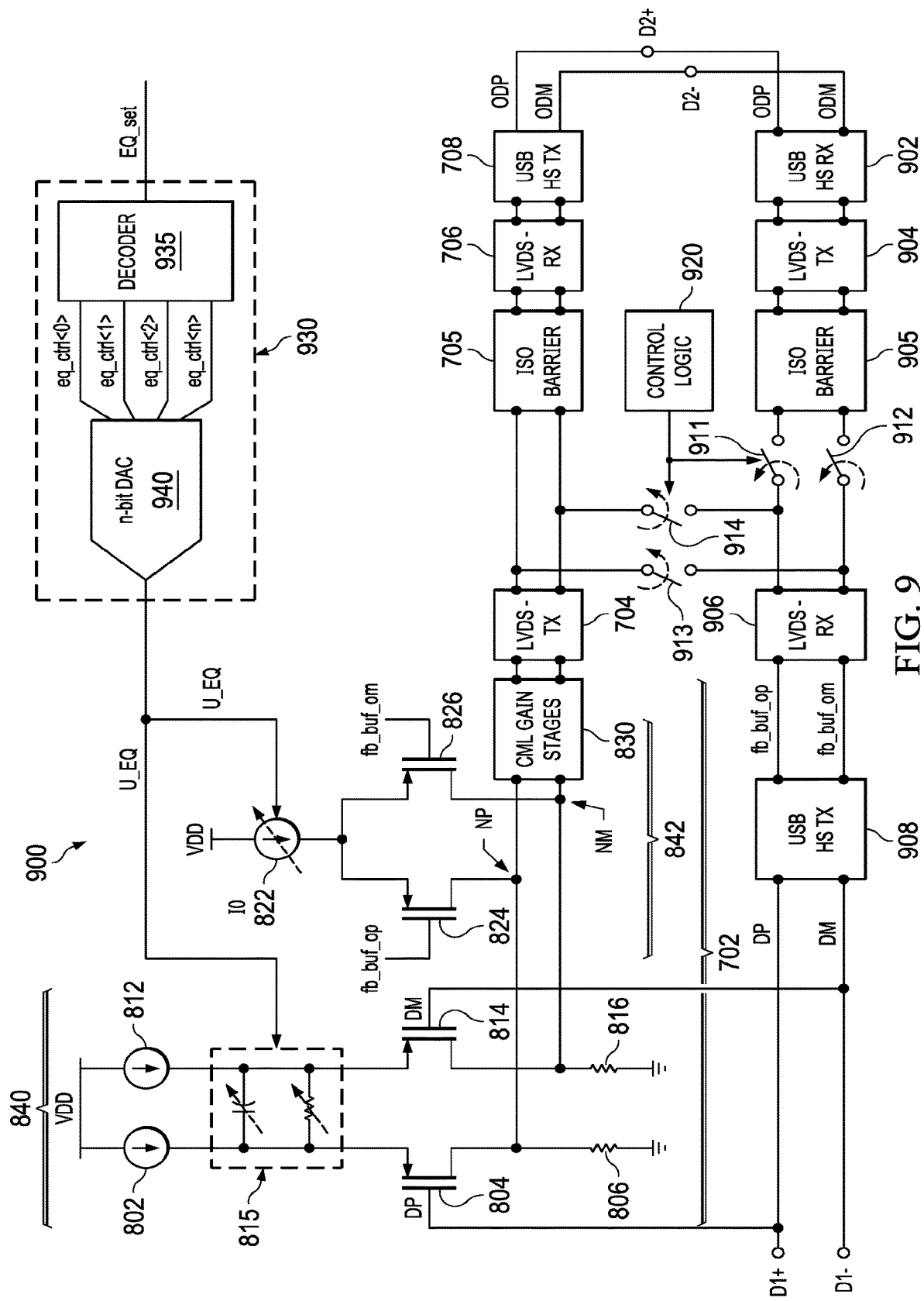
FIG. 9 is an electrical diagram, in block and schematic form, of an isolating repeater including equalization circuitry according to an example embodiment.

FIG. 9 further illustrates the construction of isolating repeater 900 according to an alternative embodiment. Those components of repeater 900 shown in FIG. 9 that are the same as components in repeater 700 shown in FIG. 7 and FIG. 8 are referred to by the same reference numerals in FIG. 9 and in the following description. Specifically, the HS channel from terminals D1+, D1− to terminals D2+, D2− in isolating repeater 900 of FIG. 9 is constructed similarly as that described above in connection with isolating repeater 700 of FIG. 8. However, the source of feedback applied to PMOS transistors 824, 826 in hysteresis stage 842 in this example embodiment differs from that in isolating repeater 700 of FIG. 8, as will be described in detail below.

FIG. 9 also illustrates an HS channel in isolating repeater 900 for the opposite signal direction from terminals D2+, D2− to terminals D1+, D1−, according to this example embodiment. As shown in FIG. 9, USB HS receiver 902 has inputs coupled to terminals D2+, D2− via lines ODP, ODM, respectively, and an output coupled to LVDS-TX 904. LVDS-TX 904 is constructed to transmit a lower voltage differential signal across isolation barrier 905. The opposite side of isolation barrier 905 is coupled to differential inputs of LVDS-RX 906 via switches 911, 912 in this example embodiment. In addition, the differential outputs of LVDS-TX 704 in the opposite HS channel are coupled to the differential inputs of LVDS-RX 906 via switches 913, 914. The output of LVDS-RX 906 at differential lines fb_buf_op, fb_buf_om is coupled to inputs of USB HS transmitter 908. The output of USB HS transmitter 908 is in turn coupled to lines DP, DM for output at terminals D1+, D1−. Control logic 920 is provided to control switches 911, 912, 913, 914. In this embodiment, control logic 920 closes switches 911, 912 and opens switches 913, 914 for USB HS communication in the direction from terminals D1+, D1− to terminals D2+, D2−. Conversely, control logic opens switches 911, 912 and closes switches 913, 914 for USB HS communication in the opposite direction, from terminals D2+, D2− to terminals D1+, D1−.

Squelch detection circuitry to enable and disable the transmitter functions, such as described above relative to FIG. 7, may be included in repeater 900 for both transmission directions, but is not shown in FIG. 9 for the sake of clarity.

In this example embodiment, the feedback signals controlling the offset of hysteresis stage 842 for isolating repeater 900 differ from those in isolating repeater 700 of FIG. 8. Specifically, in this example embodiment, the gates of PMOS transistors 824, 826 in hysteresis stage 842 in this example embodiment are coupled to differential lines fb_buf_op, fb_buf_om, respectively. Because hysteresis stage 842 is operable in USB HS receiver 702 for signals communicated through isolating repeater from terminals D1+, D1− to terminals D2+, D2−, and because switches 913, 914 are closed (and switches 911, 912 open), the offset applied by hysteresis stage 842 is controlled by feedback presented by LVDS-RX 906 in response to the output of LVDS-TX 704 in the signal path. The operation of hysteresis stage 842 for the two differential data states in isolating repeater 900 corresponds to that described above in isolating repeater 700. Conversely, USB HS receiver 702 is idle for communications in the opposite direction, from terminals D2+, D2− to terminals D1+, D1−, during which time switches 911, 912 in the signal path are closed and switches 913, 914 are open.

Accordingly, the feedback of differential lines fb_buf_op, fb_buf_om coupled to the gates of PMOS transistors 824, 826 in hysteresis stage 842 in this example embodiment will serve to reduce the amplitude of SE0 noise following an end-of-packet sequence in HS USB communications, and thus reduce or eliminate the spurious transmission of pulses from EOP dribble, as described above in connection with the example embodiments of FIG. 3, FIG. 4A, FIG. 4B and FIG. 8.

It is of course contemplated that USB HS receiver 902 for the USB HS channel in the opposite direction, from terminals D2+, D2− to terminals D1+, D1−, will be constructed to similarly include a hysteresis stage for reduction of EOP dribble, with that hysteresis stage similarly receiving feedback from the output of LVDS-RX 706.

Similarly as described above relative to FIG. 6, current I0 conducted by current source 822 in hysteresis stage 842 can be varied according to the extent of the equalization to be applied by equalizer 815. Specifically, because the SE0 state noise at terminals D1+, D1− after an end-of-packet indicator will likely by high frequency noise and because equalizer 815 will typically boost high frequency components of the received signal relative to lower frequency components, it may be useful to adjust the offset applied by hysteresis stage 842 according to the extent of the equalization applied by equalizer 815. According to an example embodiment as illustrated in FIG. 9, adjustment of this offset is effected by adjusting current I0 through current source 822 with the selection of the intended equalization setting for equalizer 815.

As shown in FIG. 9, isolating repeater 900 includes equalization control circuitry 900 to set the characteristics of equalizer 815 to the intended frequency response based on an external control signal EQ_set. According to this embodiment, equalization control circuitry 900 controls the current I0 conducted by current source 822 along with the equalizer setting applied to equalizer 815, in this example by the same control signal output by equalization control circuitry 900.

In this example embodiment, similarly as described above relative to FIG. 6, equalization control circuitry 900 includes decoder 935 with an input coupled to one or more terminals EQ_set, and having outputs coupled to lines eq_ctrl<0> through eq_ctrl<n> to indicating selection of one of n+1 equalization settings corresponding to a digital value received at terminals EQ_set. Digital-to-analog converter (DAC) 940 receives the selection signals on lines eq_ctrl<0> through eq_ctrl<n> at its inputs, and has an output presenting an analog signal U_EQ in response to the selection signals on lines eq_ctrl<0> through eq_ctrl<n>. Analog signal U_EQ is applied to equalizer 815 (e.g., to either or both of variable capacitor 808 and variable resistor 810), to establish the corresponding equalization setting for USB HS receiver 702 in this example. In addition, according to this example embodiment, current source 822 is a variable current source configured to conduct current I0 at a level corresponding to analog signal U_EQ from DAC 910 of equalization control circuitry 900. Accordingly, the current I0 provided by current source 822 in hysteresis stage 842 varies with the equalization setting applied to equalizer 815 in first amplifier stage 840 of USB HS receiver 702.

As described above, higher equalization settings (i.e., more boost at high frequencies in the frequency response) for USB HS receiver 702 will amplify the high frequency noise in the SE0 state following an end-of-packet indicator in the HS mode. According to this example embodiment, the offset of hysteresis stage 842 is increased accordingly by a corresponding increase in current I0 from current source 822.

Similarly as described above for repeater 300 in connection with FIG. 5, trimming of the receiver functions in isolating repeaters 700, 900 is also desirable. It is contemplated that similar circuitry as described above relative to FIG. 5 can also be incorporated in isolating repeaters 700, 900 of these example embodiments, thus enabling trimming of the USB HS receives during manufacture or later in a similar manner as that described above. And as also described above, additional trim circuitry or processes for trimming offset of the receiver hysteresis stages need not be provided, beyond that already typically provided for trimming offset of the amplifying stages in those receivers.

The example embodiments described in this specification enable important advantages in high-speed serial communications, such as USB communications in the HS mode. One such advantage is the reduction, if not elimination, of spurious EOP dribble transmissions resulting in repeaters such as eUSB2-to-USB repeaters and isolating USB repeaters operating in the USB HS mode. This reduction in EOP dribble can be provided during the time immediately following the end-of-packet indicator, before such time as conventional squelch detection is able to disable transmission. This reduction in EOP dribble can be attained, according to these example embodiments, without adding jitter, extra trim bits, or latency, and with little impact on die area or power consumption in the repeater. For the case of eUSB2-to-USB repeaters, the reduction in EOP is enabled for communications in either direction. Furthermore, features of one or more of these example embodiments can be implemented in a manner that is independent of the amount of equalization selected in the receiver circuitry. These and other advantages and benefits are contemplated to be enabled by one or more of these example embodiments.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. A Universal Serial Bus (USB) repeater, comprising:
    a first channel including a first receiver and a first transmitter having differential outputs, the first receiver having:
        differential inputs;
        a first amplifier stage, having first and second inputs coupled to the differential inputs, and having first and second outputs coupled to first and second load devices;
        a hysteresis stage, comprising:
            a current source coupled to the first and second outputs of the first amplifier; and
        a second amplifier stage having inputs coupled to the first and second outputs of the first amplifier stage, and having outputs coupled to first and second differential outputs of the first receiver, the first and second differential outputs of the first receiver coupled to differential inputs of the first transmitter; and
    a second channel including a second receiver having differential inputs coupled to the differential outputs of the first transmitter and having first and second differential outputs, and a second transmitter having differential inputs coupled to the first and second differential outputs of the second receiver and having differential outputs.

2. The repeater of claim 1, wherein the first receiver and the second transmitter are configured to receive and transmit, respectively, differential signals at a first pair of terminals at a first signaling level;
    and wherein the second receiver and the first transmitter are configured to receive and transmit, respectively, differential signals at a second pair of terminals at a second signaling level, the second signaling level being at a different voltage than the first signaling level.

3. The repeater of claim 1, wherein the first amplifier stage of the first receiver presents a differential signal at its first and second outputs responsive to a differential signal at its first and second inputs;
    wherein the first transmitter is configured to present a differential signal at its differential outputs responsive to the differential signal at the first and second outputs of the first amplifier stage of the first receiver.

4. The repeater of claim 1, wherein the first amplifier stage of the first receiver comprises:
    first and second current sources;
    a first transistor having a conductive path coupled between the first current source and the first load device, and having a control terminal coupled to one of the differential inputs of the first receiver;
    a second transistor having a conductive path coupled between the second current source and the second load device, and having a control terminal coupled to another one of the differential inputs of the first receiver; and
    an equalizer comprising a capacitor and a resistor coupled in parallel between the conductive paths of the first and second transistors.

5. The repeater of claim 4, wherein the capacitor is a variable capacitor and the resistor is a variable resistor;
    and further comprising:
        equalizer control circuitry having a control input coupled to an equalization control terminal of the repeater, and configured to select a capacitance of the variable capacitor, a resistance of the variable resistor, and a current conducted by the current source of the hysteresis stage responsive to a control signal at the equalization control terminal.

6. The repeater of claim 1, further comprising:
first and second current sources coupled to the first and second outputs of the first amplifier stage of the first receiver.

7. The repeater of claim 1, wherein the second receiver comprises:
a first secondary amplifier stage, having first and second inputs coupled to the differential inputs of the second receiver, and having first and second outputs coupled to first and second load devices;
a secondary hysteresis stage, comprising:
a secondary current source;
a second secondary amplifier stage having inputs coupled to the first and second outputs of the first secondary amplifier stage of the second receiver, and having outputs coupled to first and second differential outputs of the second receiver, the first and second differential outputs of the second receiver coupled to differential inputs of the second transmitter.

8. The repeater of claim 7, wherein the first receiver and the second transmitter are configured to receive and transmit, respectively, differential signals at a first pair of terminals at a first signaling level;
and wherein the second receiver and the first transmitter are configured to receive and transmit, respectively, differential signals at a second pair of terminals at a second signaling level, the second signaling level being at a different voltage than the first signaling level.

9. The repeater of claim 7, wherein the first amplifier stage of the first receiver presents a differential signal at its first and second outputs responsive to a differential signal at its first and second inputs;
wherein the first transmitter is configured to present a differential signal at its differential outputs responsive to the differential signal at the first and second outputs of the first amplifier stage of the first receiver;
wherein the first amplifier stage of the second receiver presents a differential signal at its first and second outputs responsive to a differential signal at its first and second inputs;
wherein the second transmitter is configured to present a differential signal at its differential outputs responsive to the differential signal at the first and second outputs of the first amplifier stage of the second receiver.

10. An isolating Universal Serial Bus (USB) repeater, comprising:
an isolation barrier;
a first receiver having differential inputs coupled to a first pair of terminals and comprising:
a first amplifier stage, having first and second inputs coupled to the first pair of terminals, and having first and second outputs coupled to first and second load devices;
a hysteresis stage, comprising:
a current source; and
a second amplifier stage having differential inputs coupled to the first and second outputs of the first amplifier stage, and having an output coupled to the differential outputs of the first receiver;
a first transmitter having differential inputs coupled to the first and second differential outputs of the first receiver, and having first and second outputs coupled to a first side of the isolation barrier;
a second receiver having differential inputs coupled to a second side of the isolation barrier; and
a second transmitter having differential inputs coupled to differential outputs of the second receiver and having differential outputs coupled to a second pair of terminals.

11. The isolating repeater of claim 10, wherein the first amplifier stage of the first receiver presents a differential signal at its first and second outputs responsive to a differential signal at the first pair of terminals;
wherein the first transmitter is configured to present a differential signal at its first and second outputs responsive to the differential signal at the first and second outputs of the first amplifier stage of the first receiver.

12. The isolating repeater of claim 10, wherein the first amplifier stage of the first receiver comprises:
first and second current sources;
a first transistor having a conductive path coupled between the first current source and the first load device, and having a control terminal coupled to one of the first pair of terminals;
a second transistor having a conductive path coupled between the second current source and the second load device, and having a control terminal coupled to another one of the first pair of terminals; and
an equalizer comprising a variable capacitor and a variable resistor coupled in parallel between the conductive paths of the first and second transistors;
and further comprising:
equalizer control circuitry having a control input coupled to an equalization control terminal of the repeater, and configured to select a capacitance of the variable capacitor, a resistance of the variable resistor, and a current conducted by the current source of the hysteresis stage responsive to a control signal at the equalization control terminal.

13. An isolating Universal Serial Bus (USB) repeater, comprising:
a first channel configured for communication of signals received at a first pair of terminals to a second pair of terminals, the first channel comprising:
a first isolation barrier operable to isolate a first side of the first isolation barrier from a second side of the first isolation barrier;
a first receiver having differential inputs coupled to the first pair of terminals and comprising:
a first amplifier stage, having first and second inputs coupled to the differential inputs of the first receiver, and having first and second outputs coupled to first and second load devices;
a hysteresis stage, comprising:
a current source; and
a second amplifier stage having differential inputs coupled to the first and second outputs of the first amplifier stage, and having an output coupled to the differential outputs of the first receiver;
a first transmitter having differential inputs coupled to the first and second differential outputs of the first receiver, and having first and second outputs coupled to the first side of the first isolation barrier;
a second receiver having differential inputs coupled to the second side of the first isolation barrier; and
a second transmitter having differential inputs coupled to differential outputs of the second receiver and having differential outputs coupled to the second pair of terminals;
a second channel configured for communication of signals received at the second pair of terminals to the first pair of terminals, the second channel comprising:

a second isolation barrier operable to isolate a first side of the second isolation barrier from a second side of the second isolation barrier;

a third receiver having differential inputs coupled to the second pair of terminals, and having differential outputs;

a third transmitter having differential inputs coupled to the differential outputs of the third receiver, and having first and second outputs coupled to a first side of the second isolation barrier;

a fourth receiver having differential inputs coupled to a second side of the first isolation barrier via first and second switches; and a fourth transmitter having differential inputs coupled to the first and second differential outputs of the fourth receiver and having differential outputs coupled to the first pair of terminals;

third and fourth switches coupled between the differential outputs of the first transmitter and the differential inputs of the third receiver; and control logic configured to close the first and second switches and open the third and fourth switches for communication of signals received at the second pair of terminals to the first pair of terminals, and to open the first and second switches and close the third and fourth switches for communication of signals received at the first pair of terminals to the second pair of terminals.

14. The isolating repeater of claim 13, wherein the first amplifier stage of the first receiver presents a differential signal at its first and second outputs responsive to a differential signal at the first pair of terminals;

wherein the fourth receiver is configured to present a differential signal at its first and second outputs responsive to the differential signal at the first and second outputs of the first amplifier stage of the first receiver when the first and second switches are open and the third and fourth switches are closed.

15. The isolating repeater of claim 13, wherein the first amplifier stage of the first receiver comprises:

first and second current sources;

a first transistor having a conductive path coupled between the first current source and the first load device, and having a control terminal coupled to one of the first pair of terminals;

a second transistor having a conductive path coupled between the second current source and the second load device, and having a control terminal coupled to another one of the first pair of terminals; and an equalizer comprising a variable capacitor and a variable resistor coupled in parallel between the conductive paths of the first and second transistors;

and further comprising:

equalizer control circuitry having a control input coupled to an equalization control terminal of the repeater, and configured to select a capacitance of the variable capacitor, a resistance of the variable resistor, and a current conducted by the current source of the hysteresis stage responsive to a control signal at the equalization control terminal.

\* \* \* \* \*